(12) United States Patent (10) Patent No.: US 7,472,055 B2
Garcia et al. (45) Date of Patent: *Dec. 30, 2008

(54) METHOD AND SYSTEM FOR DETERMINISTIC CONTROL OF AN EMULATION

(75) Inventors: Luis A Garcia, Laguna Niguel, CA (US); Russell E Vreeland, Foothill Ranch, CA (US); Christopher B Novak, Mission Viejo, CA (US); Gabriel G Marasigan, Rancho Santa Margarita, CA (US); Christopher A Roussel, Alpharetta, GA (US)

(73) Assignee: Broadcom Corporation, Irvine, CA (US)

(*) Notice: Subject to any disclaimer, the term of this patent is extended or adjusted under 35 U.S.C. 154(b) by 538 days.

This patent is subject to a terminal disclaimer.

(21) Appl. No.: 10/385,705

(22) Filed: Mar. 12, 2003

(65) Prior Publication Data

US 2003/0225565 A1 Dec. 4, 2003

Related U.S. Application Data

(60) Provisional application No. 60/384,390, filed on Jun. 3, 2002, provisional application No. 60/430,048, filed on Dec. 2, 2002.

(51) Int. Cl.
*G06G 7/48* (2006.01)
*G06F 7/48* (2006.01)
*G06F 9/44* (2006.01)
*G06F 9/455* (2006.01)
*G06F 7/38* (2006.01)
*G06F 17/50* (2006.01)
*G06F 9/45* (2006.01)

(52) U.S. Cl. .............. 703/25; 703/4; 703/14; 703/16; 703/20; 703/23; 712/227; 716/4; 716/5; 716/6; 717/134; 717/138

(58) Field of Classification Search ............ 703/25, 703/4, 14, 16, 20, 23; 712/227; 716/4, 5, 716/6; 717/134, 138
See application file for complete search history.

(56) References Cited

U.S. PATENT DOCUMENTS

| 6,002,861 A | * | 12/1999 | Butts et al. .................. 703/16 |
| 6,484,135 B1 | * | 11/2002 | Chin et al. .................. 703/23 |
| 6,560,573 B1 | * | 5/2003 | Scaringella et al. .......... 703/27 |
| 6,993,469 B1 | * | 1/2006 | Bortfeld ..................... 703/15 |
| 2003/0225561 A1 | * | 12/2003 | Garcia et al. ................. 703/17 |
| 2004/0034841 A1 | * | 2/2004 | Reblewski .................... 716/8 |

OTHER PUBLICATIONS

Kudlugi et al. A Transaction-Based Unified SImulation/Emulation Architecture for Functional Verification. Jun. 2001.*

* cited by examiner

*Primary Examiner*—Kamini S Shah
*Assistant Examiner*—Shambhavi Patel
(74) *Attorney, Agent, or Firm*—Sterne, Kessler, Goldstein & Fox P.L.L.C.

(57) ABSTRACT

An emulation-based event-wait simulator including an application module to configure and command verification processes on a design under test (DUT). An event dispatcher is in communication with the application module to deliver commands to the DUT. A plurality of transactors are in communication with the event dispatcher to forward the commands to the DUT. A channel controller is in communication with the transactors to process and forward the commands to the DUT, wherein the channel controller also receives messages from the DUT, processes the messages, and forwards the messages to the transactors for delivery to the event dispatcher and the application module.

4 Claims, 20 Drawing Sheets

METHOD AND SYSTEM FOR DETERMINISTIC CONTROL OF AN EMULATION

CROSS REFERENCE TO RELATED APPLICATIONS

This application claims priority to commonly assigned U.S. Provisional Patent Application No. 60/384,390, filed Jun. 3, 2002, and to commonly assigned U.S. Provisional Patent Application No. 60/430,048, filed Dec. 2, 2002, entitled METHOD AND SYSTEM FOR DETERMINISTIC CONTROL OF AN EMULATION, which are incorporated by reference herein in their entirety.

FIELD OF THE INVENTION

This invention relates generally to system and ASIC design verification, and more specifically, to deterministic verification techniques.

RELATED ART

As system-on-chip (SOC) designs grow increasingly complex, the verification of those designs becomes more challenging. Recent trends in the electronics industry appear to show that verification has become the single most time-consuming part of a SOC design schedule. Thus, there is a need for broader, deeper system-level verification.

Conventional verification methods provide a means to test basic hardware functionality, but lack the throughput to handle system-level verification of complex SOC designs. This lack is apparent in designs that integrate multiple components on a signal chip. This lack exposes companies to substantial risks if design teams miss product delivery dates due to increased verification times, or worse, design errors that require expensive chip re-spins.

There are various approaches available to compensate for this challenge. For example, the need for higher verification speed can be addressed by creating specific C-test benches or using standard electronic design automation (EDA) tools interfacing directly with register transfer level (RTL)/gates via standard programming language interface (PLI) calls. The increased productivity gained by this approach becomes insufficient, however, as the SOC design size increases.

This insufficiency in speed and efficiency reveals the verification bottleneck of simulating the register transfer level (RTL). Once this bottleneck is reached, system-level verification schedules often include a mixture of standard simulation to verify block, large block functionality, and partial chip-level functionality plus co-simulation, vector acceleration, prototyping, in-circuit emulation, or transaction-based verification. This second tier of verification was considered insurance in the past, but is now becoming a necessity to find the dreaded hidden corner-cases in large SOC designs.

Conventional solutions also include hardware-assisted techniques. These techniques use a co-simulation methodology that pairs a hardware design language (HDL) test bench with a high-speed hardware accelerator. In these approaches, the HDL test bench runs on the host workstation transferring data. The HDL test bench synchronizes with the hardware platform through an interface at each event exchange. This synchronization is a slow but necessary process for software simulation. Hardware accelerators can provide the advantage of dedicated parallel processors to distribute the evaluation of RTL/gates events. For example, simulation speed increases up to a few thousand cycles per second for functional simulations, but slows down to a few hundred cycles per second for full-timing simulations. While this performance is excellent compared to software simulation solutions, it is still too slow for thorough system-level verification of SOCs.

Alternatively, data streaming is another technique. Data streaming can use a workstation, personal computer (PC), or other device, such as a vector-generation device to send bit-level vectors on a clock cycle or clock enable basis to a hardware accelerator or emulator. This approach works well in non-interactive systems that, once configured, perform a certain function repeatedly (e.g., formatting an MPEG block from incoming data). This technique can also be extended to interactive data streaming applications, but the increased number of vectors required make the techniques cumbersome. The overall verification speed slows down considerably because the vectors need to be generated, transmitted, received, decoded, tagged, compared, and stored by the data streaming device/host processor.

Data streaming performance is usually limited by the streaming/recording device to about 20-30 MHz for small width vectors in non-interactive applications. The speed of applications that use interactive data streaming is much slower, usually up to 10-100 kHz with a decline in speed as vector width increases. This is still much faster than conventional software simulation.

The trade-off between the various verification methods is often speed versus the productivity gained by having an automated netlist compiler, and the probing of the SOC design. Both these options offer the highest verification throughput (100 kHz to 20 MHz) and highest quality of verification, but usually require the development of a slowed-down target board to serve as a prototype that connects to a number of system interfaces. This prototyping to thoroughly verify system integrity (hardware, firmware, and software) is not always practical or possible in cases where the target system is not readily available or where the target system can not be slowed down. In many cases, slowing down a target system and other systems connected to it is the biggest impediment to the adoption of these verification methodologies.

An approach for verifying SOC designs accurately and with reproducible results is needed. Further, an approach for verifying SOC designs in a deterministic manner such that errors can be isolated quickly and completely is needed.

SUMMARY OF THE INVENTION

Accordingly, the present invention is directed to a deterministic emulator and associated hardware and software that substantially obviates one or more of the problems and disadvantages of the related art.

In one aspect of the invention there is provided an emulation-based event-wait simulator including an application module to configure and command verification processes on a design under test (DUT). An event dispatcher is in communication with the application module to deliver commands to the DUT. A plurality of transactors are in communication with the event dispatcher to forward the commands to the DUT. A channel controller is in communication with the transactors to process and forward the commands to the DUT, wherein the channel controller also receives messages from the DUT, processes the messages, and forwards the messages to the transactors for delivery to the event dispatcher and the application module.

In another aspect there is provided a system for evaluating performance of a device under test (DUT) including a deterministic emulator with a channel controller that receives data packets from an application module. A plurality of transactors forward the data packets to corresponding output channels to be transferred to the DUT.

In another aspect there is provided a system for evaluating performance of a device under test (DUT) including a deterministic emulator with a channel controller that receives data packets from an application module. A deterministically controlled clock within the deterministic emulator is responsive to commands from the application module. A plurality of transactors forward the data packets to corresponding output channels to be transferred to the DUT. The transactors gather the data packets while the clock is running, and forward the data packets to the corresponding output channels and hence, back to the software (application module), while the clock is stopped. While the clock is stopped, the output messages occur at the same "time", but they actually are transferred one at a time.

In another aspect there is provided a system that deterministically evaluates operations of a circuit design including an application module that determines a set of commands for execution by a DUT. A channel controller delivers the set of commands to the DUT. A source level debugger monitors the DUT during the execution of the set of commands. An event dispatcher receives a set of events from the DUT that includes results of the execution of the set of commands.

In another aspect there is provided a system that deterministically evaluates operations of a circuit design including an application module that communicates with an emulator that emulates the circuit design, and that awaits event notifications from the emulator. Transactor drivers receive responses from the emulator. The application module enters an event-wait state. Zero simulation time transpires for servicing the responses. These responses are translated into events that are handled by the event-wait simulator one level up, when all events are processed.

Further embodiments and features of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

DETAILED DESCRIPTION OF THE PREFERRED EMBODIMENTS

Figure 1A:
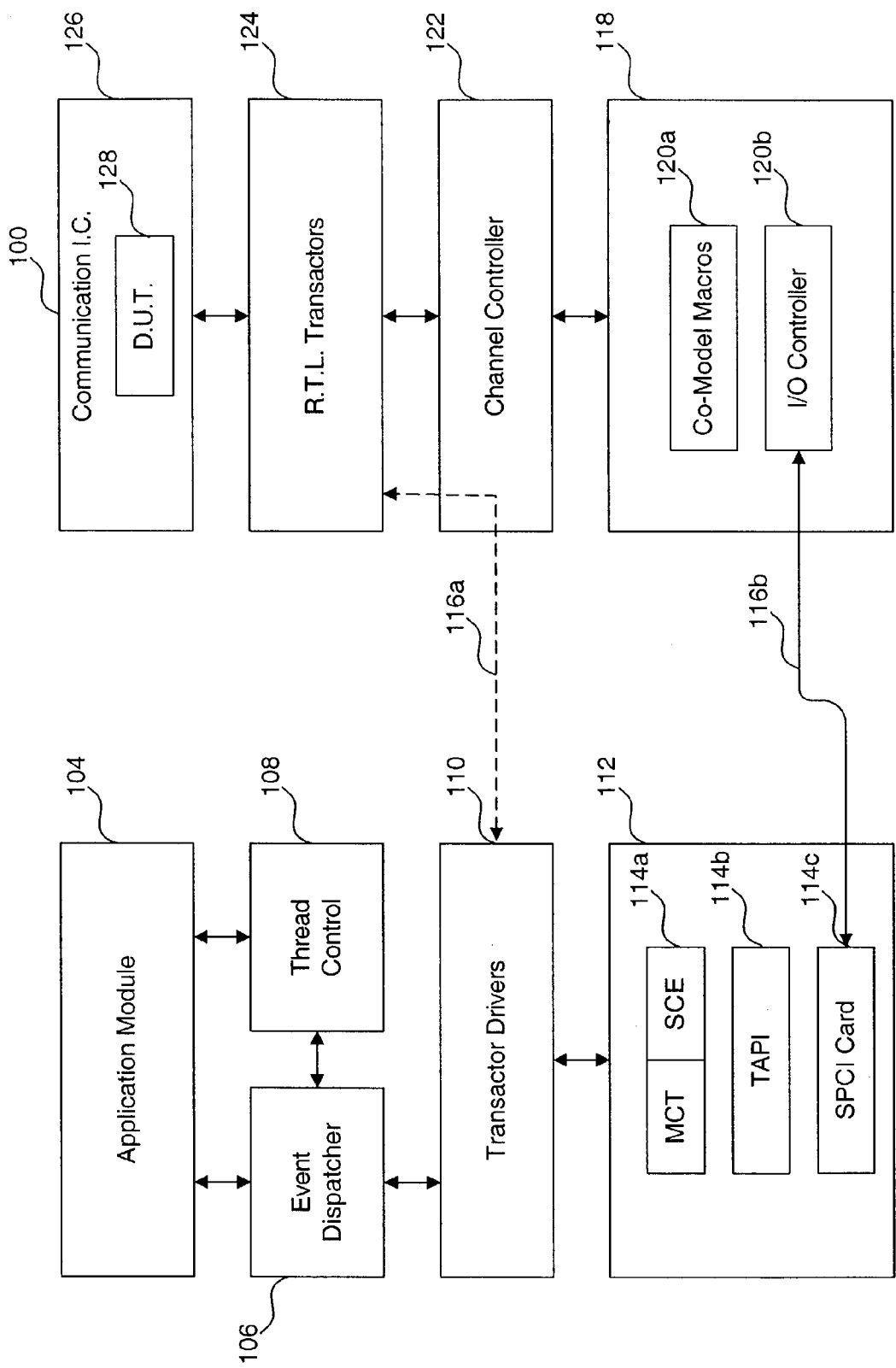
FIG. 1A shows a block diagram of a simulator/emulator according to an embodiment of the present invention.

The present invention will now be described with reference to the accompanying drawings. In the drawings, like reference numbers indicate identical or functionally similar elements. Additionally, the left-most digit(s) of a reference number identifies the drawing in which the reference number first appears.

The present invention is particularly applicable in situations where the actual design under test (DUT) is not practical to test in a pure emulation mode. For example, effectively testing all the corner cases on a cable modem head end may require arranging hundreds of cable modems to simultaneously send data to the head end being tested. This presents an obvious logistical and hardware challenge. Yet another situation that is difficult to test is the case of multiple I/O channels all operating at different clock rates on the DUT. Another situation that may be difficult to test is slowing down a device that normally operates on a clock in the range. The task of slowing down the entire test fixture of hundreds of MHz to a low frequency in a KHz range may itself create difficult problems, or may not be possible.

The present invention provides methods and systems for an emulation-based event-wait emulator that provides for testing of complex designs. The emulator can operate with a design under test (DUT), and associated test hardware, or transactors, contained within it thus avoiding the need for a prototype or target hardware. The emulator provides deterministic behavior for interactive simulations through a combination of event queuing methods. In an embodiment, the DUT is stimulated with messages that include commands. These commands translate into one or more vectors for the DUT. DUT operations on these vectors are recorded and can be fed back to the emulator, which optionally provides additional input stimulus to the DUT.

In a further embodiment, an event-wait message protocol utilized in a transaction-based environment (operating in either or both emulation and/or software simulation modes) operates over a communications application programming interface (API) to service multiple concurrent events. As the environment performs operations, events are generated between emulation and simulation modules. These events are encoded in a protocol in accordance with an embodiment of the present invention to optimize transmission and reception with the DUT. The ability to service multiple concurrent events provides the environment with a realistic evaluation of the DUT. In one embodiment, a protocol is employed within a bi-direction physical communication layer.

In accordance with additional embodiments of the present invention, a method and system for deterministically controlling an emulation environment is described. The method models actual signal information as events with a discrete time simulator that allows for the creation of stimulus in response to the events. In one embodiment, the emulator and simulator are logically coupled and controlled by a timer queue module and event-loop module. The timer queue module orders callback events so that it can return the emulation time for a given signal. The event-loop module arbitrates processing to the emulator that is waiting for event notifications, i.e., notification that events have been processed and/or the results obtained by processing the events.

An embodiment of the present invention uses a transaction-based emulation system where the emulated design is implemented as a synchronous, cycle accurate equivalent representation of the original design such that the clock for the emulated design can be stopped and restarted without causing any malfunction of the emulated design.

In one embodiment, the present invention includes transactors that communicate via messages. The transactors can operate in parallel. They manage the platform/driver(s) (PCI, Ethernet, etc.) and the flow of data to and from the DUT. Input messages can provide stimulus information to the DUT. The DUT forwards data to the transactors, which, in turn, generate output messages. The system includes a clock module that communicates with the transactors and can stop the system or one or more transactors. This eliminates the possibility of inherent non-deterministic simultaneous operation in the system, such as, e.g., asynchronous or reply acknowledge messages.

An embodiment of the present invention includes a channel controller capable of operating with both the emulation and simulation components of a transaction-based environment. The channel controller controls all of the message traffic between the transactors and the software simulator. Whenever one or more transactors require servicing, they each generate an output message to the channel controller. The channel controller processes each message and sends it to the application module.

Event- and Transaction-Based Methodologies

Transaction-based simulation combines the best qualities of homegrown C-test benches, standard EDA tools, and in-circuit emulation. This results in sophisticated software test benches that stimulate the SOC as if it were on a target system. Transaction-based simulation can link abstract models of the system running on a workstation with the detailed RTL/gate level implementation running on an emulator. In some embodiments, the foundation is a transaction interface with a high bandwidth, and a low latency physical connection between the emulator and workstation (application module).

Transactions include high-level commands (Command/Address/Data) that can be sent from a software C driver to an RTL transactor that drives a particular interface of the DUT. These high-level transactions translate into one or more vectors for the DUT. Several orders of magnitude of improvement in performance may be achieved by reducing the amount of interfacing between the test bench and the emulator (which can include the DUT), and taking advantage of the inherent speed of the C-test bench and emulator. Transaction-based verification enables exhaustive tests of complex designs without the need for a prototype or target hardware. In addition, it can be operated in several modes to allow users to take full advantage of emulation speeds and verification methodologies. Thus, the transaction based verification of the present invention overcomes the limitations of software simulation performance and leverages the expressive power of high-level software development.

Emulation-Based Event-Wait Simulator

The Event-Wait Message Protocol is an algorithm built on top of a communication API to service multiple concurrent events. In this environment, the software is in total control of the simulation/emulation being performed. It generates all of test stimulus and controls all hardware simulation clock cycles. Note that the application module (the "software") and the device-under-test (the "hardware") never execute concurrently. This maintains determinism and repeatability throughout the run.

First, a software Event Manager collects a list of relevant events from the registered software components. Typically, these components will be mostly made up of stimulus generators, but may include data collectors or other DUT related pieces of support code.

Next to the Event Manager, the TimerQueue is the most important software component. It collects and sorts a list of timeout requests from the registered components. This timeout list is the primary mechanism for determining how long the hardware emulation should run before returning control to the software. The Event Manager asks the TimerQueue for the shortest registered timeout period, sets the timeout value, then enters the "event-wait" loop. At this point, the software is dormant until a relevant event, including but not limited to the expiration of the timer, is detected.

In the event-wait loop, the middle, or transactor driver, layer of software sends a clock advance command to the hardware to start simulating for the programmable amount of time. The DUT now performs operations based on the stimulus or configuration provided by the application software. During this time, the DUT sends multiple service request messages back to the transactor layer. Every time a message is sent across the interface, hardware operation is stopped until serviced by all the software layers. Upon receipt of a service message callback, the software exits out of its event-wait loop to service the hardware. If appropriate, the transactor layer generates an event to indicate to the application module that a specific condition has occurred. The Event Manager then distributes the event to the registered recipient. In the case of a timeout event, the Event Manager passes control to the TimerQueue, which then distributes the event notification to the one or more objects waiting for that specific amount of time to expire.

Once the application software has serviced the event, the sequence starts over again.

The "event-wait" algorithm enables communication with numerous tools/models used in an ASIC verification environment (both software and hardware assisted). Without it, multiple parallel threads happening in the design under test would have difficulty being deterministically controlled in software.

This capability, in essence, converts an emulation environment into a "quasi-simulation" environment.

A transaction-based verification system according to an embodiment of the present invention is shown in FIG. 1A. In FIG. 1A, system 100 includes an application module 104, an event dispatcher 106, and a thread control 108. Also included are transactor drivers 110, a transport layer module 112, a physical layer module 118, a channel controller 122, RTL transactors 124, and a communications integrated circuit (IC) that includes at least one DUT 128.

The application module 104 is described here and in further detail below with respect to FIG. 2. The application module 104 provides the commands that will be used to test the DUT 128. The application module 104 is in communication with the event dispatcher 106 as well as to the thread control 108.

The event dispatcher 106 is in communication with the transactor drivers 110, as well as to the thread control 108. The event dispatcher 106 controls the timing of stimulus (commands and events) and includes part of the wait-timing logic described herein with regard to the event-wait protocol. The event dispatcher 106 provides notifications to components so events happen in an order that is required by testing conditions set by the application module 104.

The thread control 108 provides control over the one or more threads of stimulus to the DUT 128. The thread control 108 communicates with the components of the application module 104 and the event dispatcher 106.

The transactor drivers 110 are variously configured interfaces for communicating with the RTL transactors 124. Logical communication path 116a indicates the flow of stimulus to and from the drivers 110, through the channel controller 122, and to the RTL transactors 124. The transactor drivers 110 are in communication with the event dispatcher 106.

The transport layer module 112 provides the stimulus through interfaces to the communications layer module 118. This is the physical transport path 116b for stimulus within the system 100. As shown in FIG. 1A, one example of module 112 includes a multi-channel transport/standard co-emulation (MCT/SCE) application programming interface 114a, Transaction Interface Portal API application program interface (TAPI) 114b, and peripheral component interface (SPCI) card 114c. Interfaces 114a provide connectivity for the transactor drivers 110 to the emulation environment of modules 118-128. The transport layer 112 is in communication with the transactor drivers 110.

Stimulus is provided by path 116b to the physical layer 118. As shown for example purposes, co-model macros 120a and I/O controller 120b are included in module 118. Modules 120 provide the stimulus, commands and/or events, which in one embodiment are messages/stimulus, to the channel controller 122.

The channel controller 122 is in communication with the physical layer 118. The channel controller 122 receives stimulus originating from the event dispatcher 106 and the RTL transactors 124. The channel controller 122 is also in communication with the RTL transactors 124.

The RTL transactors 124 are in communication with the communications IC 126. The RTL transactors provide the interface to the various ports being utilized to access the DUT 128. Thus, conceptually, FIG. 1A may be thought of as having hardware on the right-hand side and software on the left-hand side. In other words, the hardware on the left-hand side may be put into a hardware box, i.e., the RTL code can be synthesized. Everything on the right-hand side of FIG. 1A represents an emulator.

There are any number of ways of implementing the transport layer (boxes 112 and 118 of FIG. 1A). TAPI is one way, and the use of an SPCI board that resides on a PCI back plane communicating with a set of co-model macros 120a, is also one particular way of implementing the invention, but the invention is not limited to this particular transport layer hardware.

In this particular implementation, the SPCI card 114c and the co-model macros 120a support reads and writes of either 512 bits or 1024 bits.

TAPI 114b is the software layer on top of the SPCI card 114c that interprets a read or write command from the application module 104 and converts them into stimuli. TAPI 114b repackages the test vector (the 512 or 1024 bits) into a number of different transfers across the interface. A particular card used in one embodiment transfers data 86 bits at a time, so the test vector is packaged into a number of PCI transactions that take place via the SPCI card 114c. The SPCI card 114c packages them on the left-hand side of FIG. 1A, and the I/O controller 120b on the right-hand side unpackages them. The I/O controller 120b receives the stimuli and reverses what the SPCI card 114c did, reconstituting the vector into 512 or 1024 bits, and giving it to the co-model macros 120a. The co-model macros 120a are thus part of an asynchronous interface that syncs up with the DUT 128.

MCT 114a is essentially a set of specifications for transmitting data across the interface, and provides a mechanism for how data should be used in transaction-based form, but does not itself specify any details on how to implement actual operations. The inputs and outputs to the MCT 114a are a set of APIs for reading and writing.

The interaction between the transactor drivers 110 and the MCT 114b includes a "data set" and a "data get", which is analogous to data writes and data reads. The data, as noted above, is essentially a vector going across the interface. The channel controller 122 takes the data and routes it to the appropriate RTL transactors 124.

The transactor drivers 110 are essentially functions that perform particular tasks. For example, suppose that on the application module 104 side there is an internet packet that needs to be transmitted, (for example, an Ethernet) packet. Once the packet has been created, a function needs to be called that will transmit the packet from the application module 104 to the appropriate RTL transactor 124 to stimulate the DUT 128. The transactor drivers 110 do exactly that. A set of APIs is called that transfers data to the RTL transactors 124, or transfers data from the RTL transactors 124 through the channel controller 122, and the lower level transport layer back to the transactor driver 110. Thus, there is a set of commands for each interface, for example, Ethernet, 10baseT, 100baseT, GB, UART, PCI 32 bit, PCI 64 bit, MPEG, MPEG with DOCSIS, custom standards for cable modems, USB, memory interfaces, SDRAM, etc.

Each packet to be transmitted includes a header and a payload. The header is based on the interface standard. A packet is received, for example, from the DUT and captured by the RTL transactors 124. On the RTL transactor 124 side, the packets are received, including the preamble and the header and any other overhead. Once the packet is received, an event happens that physically stops the hardware side, and sends the entire packet to the transactor driver 110. The MCT layer recognizes that a message has been received and that it needs to generate a callback. Thus, the transactor driver 110 gets the callback, reads the entire packet, and puts it in a buffer. At this point, the packet is ready for processing, for example, where the application module 104 can compare the received packet with the expected packet.

Thus, the transactor drivers 110 are a mechanism of encoding and transmitting information to the emulator, or, if the information is already pre-encoded, then it only needs to be transmitted (without a need for encoding). Then, the transactor drivers 110 receive callbacks from the emulator, and decode it. Alternatively, instead of decoding, the transactor drivers 110 can move the data up to the event dispatcher 106, or the application module 104.

Figure 1B:
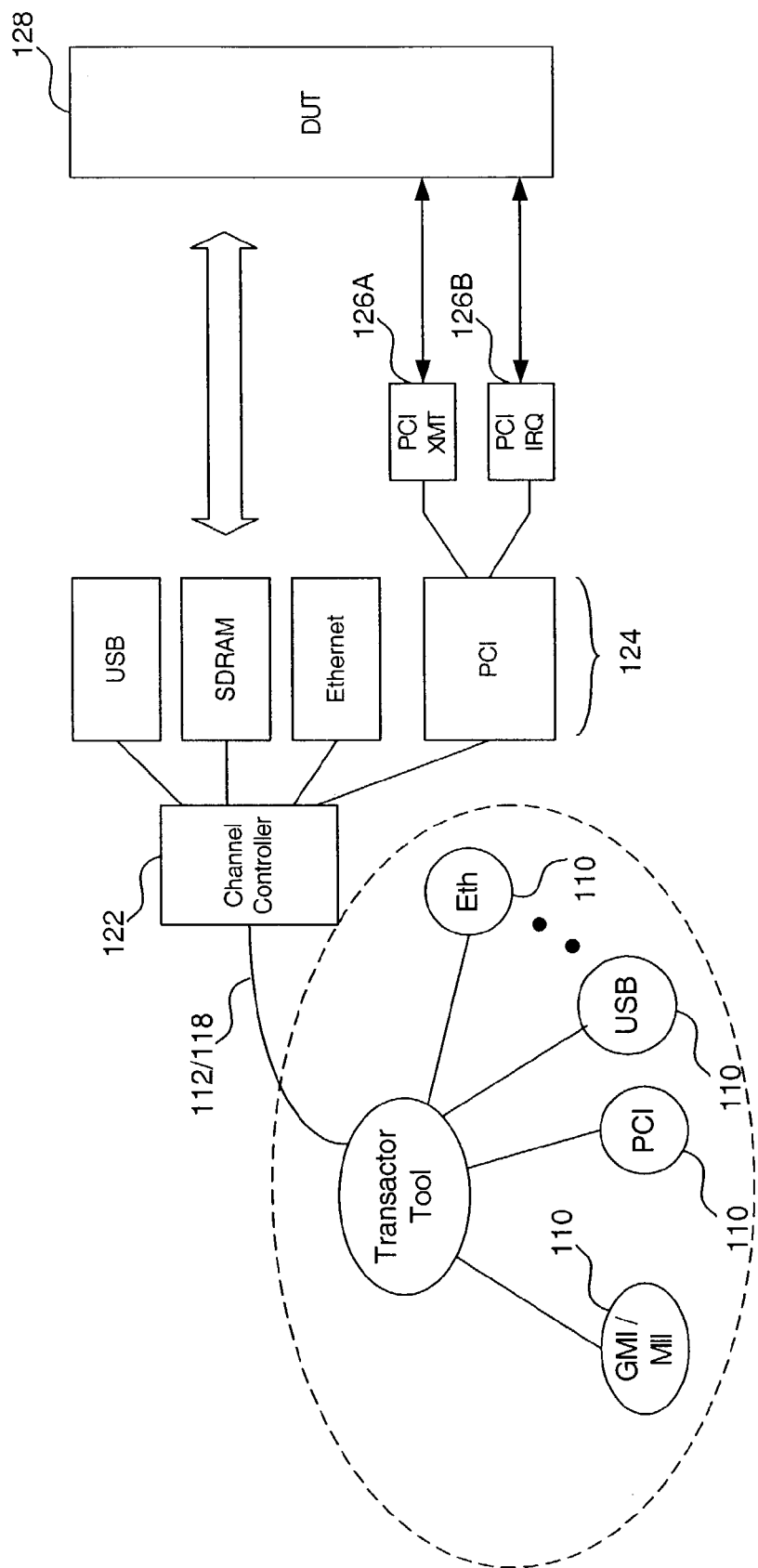
FIG. 1B illustrates the role of the transactor drivers in accordance with an embodiment of the present invention.

The role of the transactor drivers 110 is illustrated in FIG. 1B. As shown in FIG. 1B, the transactor drivers 110 include a transactor tool that is used to encode packets for the various interfaces, for example, the PCI interface, the GMI/MII interface, the USB interface, the Ethernet interface, etc. The transactor drivers 110 communicate over the physical layer 118 and the transport layer 112 with the channel controller 122, which in turn uses transactors 124 to communicate with the DUT 128.

FIG. 1B also shows a PCI transactor 124, which also includes a PCI transmit module (XMT) 126A and a PCI interrupt request module (IRQ) 126B, through which the PCI transactor 124 communicates with the DUT 128.

In addition to regular data being sent back and forth between the hardware side and the software side, each of the transactors 124 also can monitor error conditions, such as parity errors, and status information being transmitted, which is specific to each particular interface.

Thus, the transactors 124 transmit and receive data to and from the DUT 128. When the transactors 124 receive data, if the transactor 124 receives a message from the application module 104 requesting more data, the transactor driver 110 will provide it with more data. When the transactor driver 110 finishes providing the additional data, then another event is generated at the transactor 124, indicating to the application module 104 that it is done with the transmission of the data, and requesting instructions from the application module 104 for what to do next. Whenever the transactor 124 completes the operation, it generates an event that is interpreted by a higher-level module.

On the emulation side, there are at least two clocks—a high-speed clock (uncontrolled clock, or UCLK) that is free-running and is used by the control logic and the channel controller 122. There is also a controlled clock (CCLK), and clocks derived from CCLK, which are ultimately controlled by the application module 104 by means of a clock advancer. The channel controller 122, upon command from the application module 104, instructs the CCLK to run continuously, run for a preset number of cycles, or not run at all. Upon instruction from the application module 104, the CCLK in the emulator can advance by, for example, 100 nsec, or whatever time increment the application module 104 wants.

With the use of a controlled clock, the present invention allows for testing of a DUT 128 with multiple input/output channels. It enables loading the transactors 124 with test vectors for multiple channels during "zero simulation time," and then, upon restarting of the clock CCLK, flooding the DUT 128 with data on multiple (or all) channels. This avoids the situation of having latency and mis-synchronization affect the outcome of the testing. This also allows all events that are meant to occur synchronously to actually be synchronous, without concern for the latency and other transmission effects of the simulation/emulation setup. Phrased another way, it allows for a deterministic emulator, or an emulator with deterministic clock control.

The transactors 124 send data to the application module 104, and the operation of the hardware is stopped until the application module 104 responds with the message that it is in an event-wait loop. This is a form of an acknowledge message.

Each RTL transactor 124 is in charge of starting and stopping its transmission of data, and stopping the clock CCLK at the correct time. Generally, the clock CCLK is stopped whenever the transactor 124 runs out of data to transmit, and it is still in an operational mode (e.g., for one processing cycle, or for a number of processing cycles). Thus, if an Ethernet transactor 124 transmits data, it will stop the controlled clock CCLK inside the emulator and will send a message to the software side, indicating that it completed the task that it was commanded to do. In other words, it generates a callback (see FIG. 1G and discussion below). At the application level, the application module 104 receives the callback, indicating that the transactor 124 finished transmission. Thus, the time can be advanced forward, to simulate no activity. In other words, the transmission of data between the hardware side and the software side is not on a clock-by-clock basis but is on an event-by-event basis, forming the basis for a high-level event simulator.

Figure 1C:
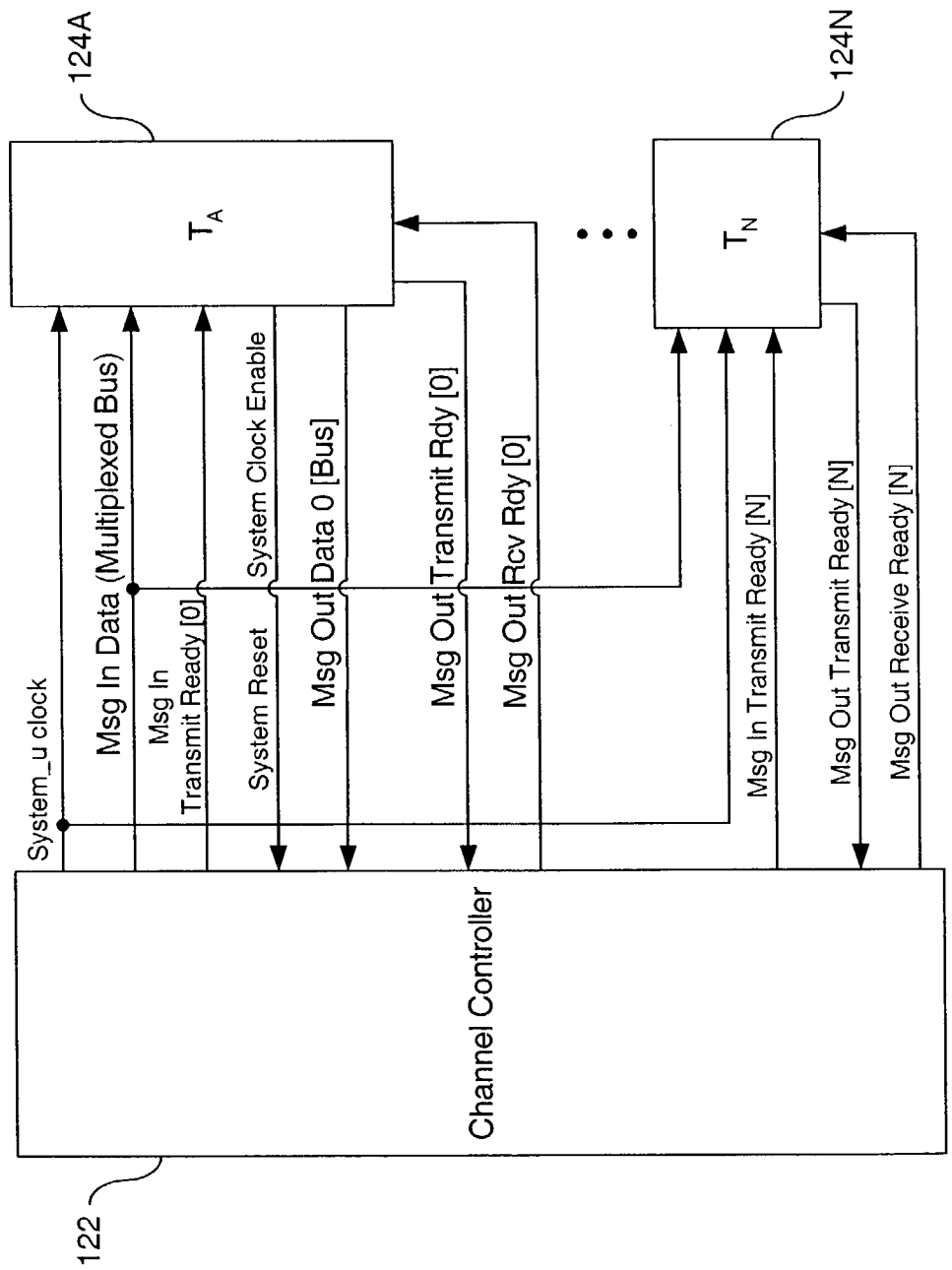
FIG. 1C illustrates the relationship between a channel controller and transactors in accordance with an embodiment of the present invention.

A transactor 124, at the RTL level, is a state machine that takes the commands sent by the application module 104, and sequentially transmits it to the pins on the DUT interface, to stimulate the DUT 128. FIG. 1C illustrates the relationship between the channel controller 122 and the transactors 124A-124N. As shown in FIG. 1C, the transactors 124 have uncontrolled clock UCLK as input. The transactors also have a bus with message-in data, message-out receive ready, and message-in transmit ready. The channel controller 122 is essentially an interface between an asynchronous domain and a synchronous domain. FIG. 1C shows the interface between the channel controller 122 and RTL transactors 124A-124N, which uses a tri-state multiplexed bus for data going between the channel controller 122 and the RTL transactors 124.

Note that the application module 104 can interact with the DUT 128 through high-level commands. The present invention therefore provides a bandwidth allocation mechanism, based on the event-wait algorithm. A number of transactors 124 can be queued up with data, regardless of the speed of the pipeline (interface) connecting the application module 104 with the DUT 128. The determinism of the emulator is maintained because the hardware stops until a message from the application module 104 is received, directing the emulator to restart (i.e., directing the CCLK to restart).

The event-wait algorithm is implemented in the event dispatcher 106, and uses time stamps to track when events occur. In one embodiment, pseudo-threads are used in the thread control module 108, to keep track of events.

The source-level debugger, in one embodiment, may be a special transactor that monitors each and every operation of the DUT 128 (for example, a MIPS microprocessor, or a Verilog implementation of a MIPS microprocessor). A tool called Trace Gate monitors every operation of the MIPS microprocessor, which has a gated clock, and sends a message back to the application module 104 every time an instruction is executed. These messages are then used to connect the MIPS processor instructions to generic debug tools.

Another tool is called Bus Device which provides additional encoding/decoding functions based on the interface type in response to a callback. Another "abstract class" provides members of the Bus Device with mapping to various addresses internal to the DUT 128 (e.g., MIPS, MAC, peripheral, etc.) By switching the abstract class, it is possible to access the internal addresses through the various different interfaces, without having to modify the source code.

Figure 1D:
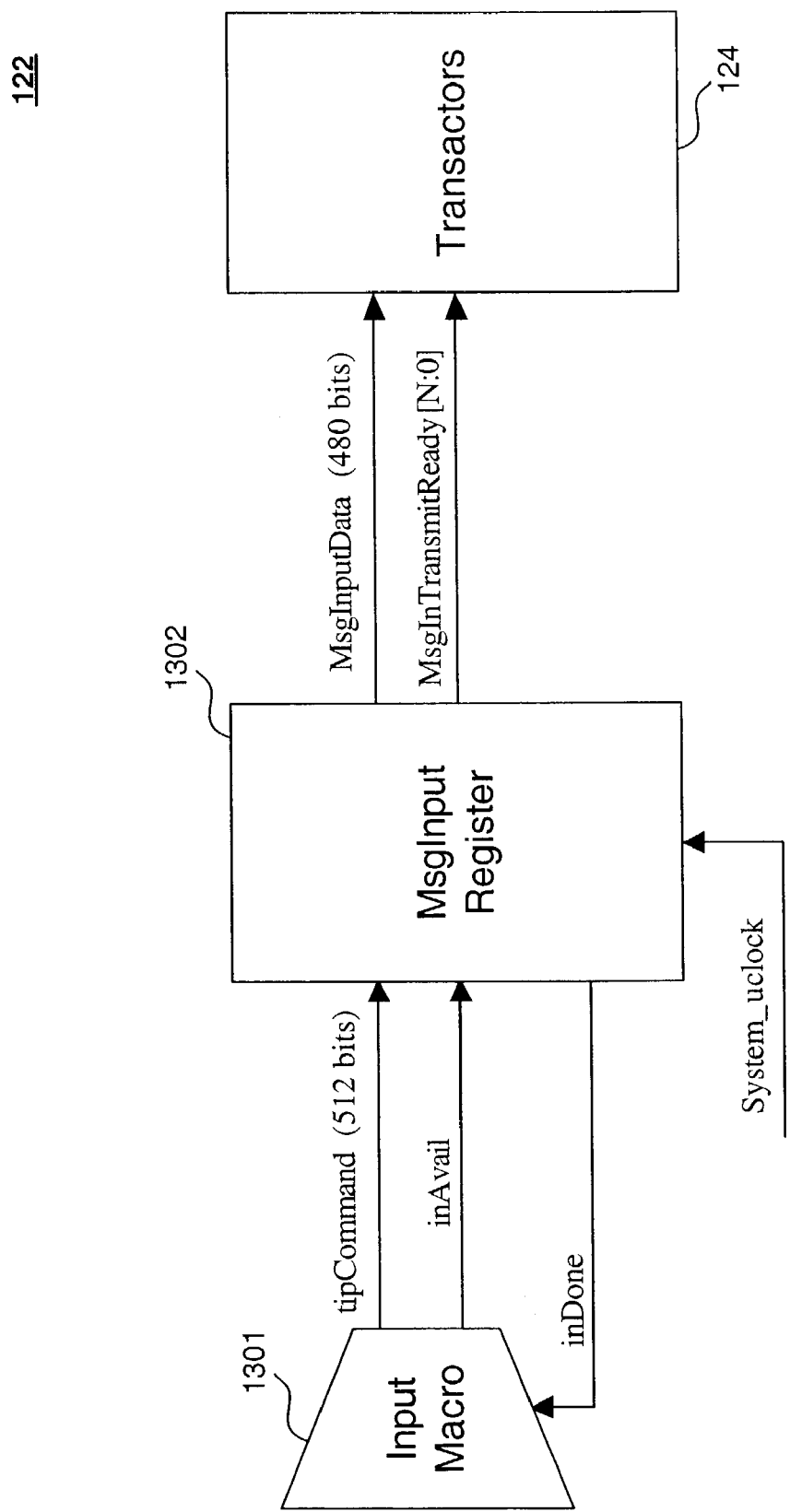
FIGS. 1D-1E illustrate a channel controller in accordance with an embodiment of the present invention.

Thus, the channel controller 122 provides the application module 124 control of multiple, independent parallel transactions. The channel controller 122 functions as a transport layer in a software/hardware communications protocol. It provides fine control of the emulation (control) clock CCLK so that message exchange occurs in a deterministic manner. In other words, the channel controller 122 effectively causes the emulator to work like a very fast, cycle-based simulator. The input and output halves of the channel controller 122 may be independent designs. The input half, which is shown in FIG. 1D, includes an input macro 1301, which is interfaced to a message input register 1302, which in turn is interfaced to the transactors 124, as shown on FIG. 1D. The input macro 1301 provides the interface to the physical data cable leading back to the work station on which the application module 104 is running. The active message in Msg_In_Transmit_Ready [N:0] is decoded from the seven bits of the tipCommand defined as the input port ID.

Figure 1E:
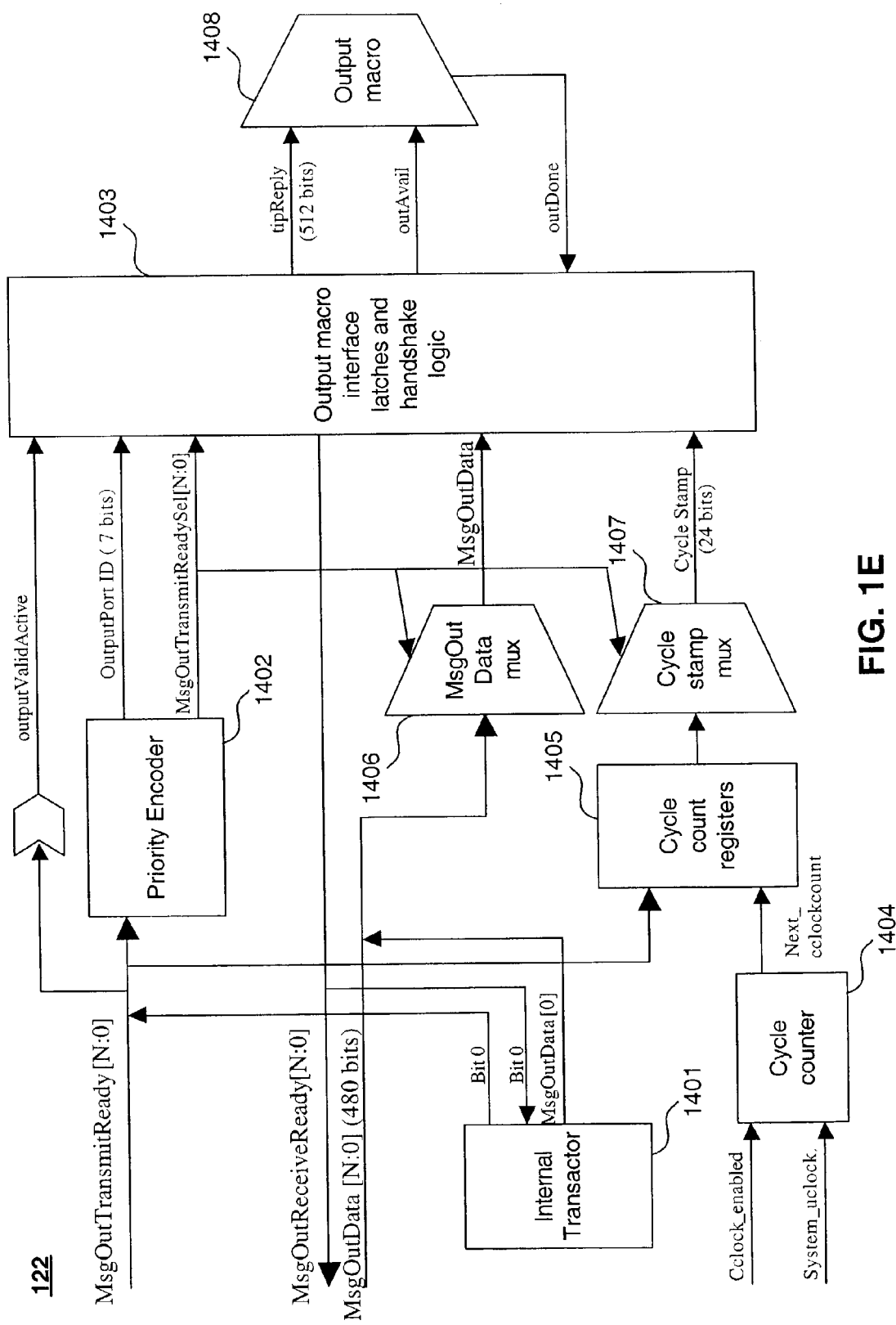

The output portion of the channel controller 122 is illustrated in FIG. 1E. As shown in FIG. 1E, the channel controller 122 includes a priority encoder 1402 for transactor output messages, with a handshake back to the transactor 124. A controlled cycle counter 1404 is used to keep track of the CCLK clock status. Cycle count registers 1405 are also used in conjunction with the cycle counter 1404 and a cycle stamp multiplexer 1407 to keep track of the CCLK clock time. This time is transmitted every time Msg_Out_Transmit_Ready [N:0] goes active.

Output macro interface latches and handshake logic 1403 is used for multiplexing of selected output messages and cycle stamps to the output macro 1408, which in turn acts as the portal across the physical cable to the work station on which application module 104 is running.

Determinism is achieved by forcing messages between the emulator and the application module 104 to be "zero time events". An output message stops the controlled clock CCLK. Control is then given to the application module 104, which processes beginning with the callback function bound to the output port that sent the message. Before the application module 104 returns control to the emulator, it sends a special, "enable" message to the channel controller 122/clock advancer, which re-starts the controlled clock CCLK if:

no other output messages are pending, no transaction is disabling CCLK (see FIG. 1E).

Figure 1F:
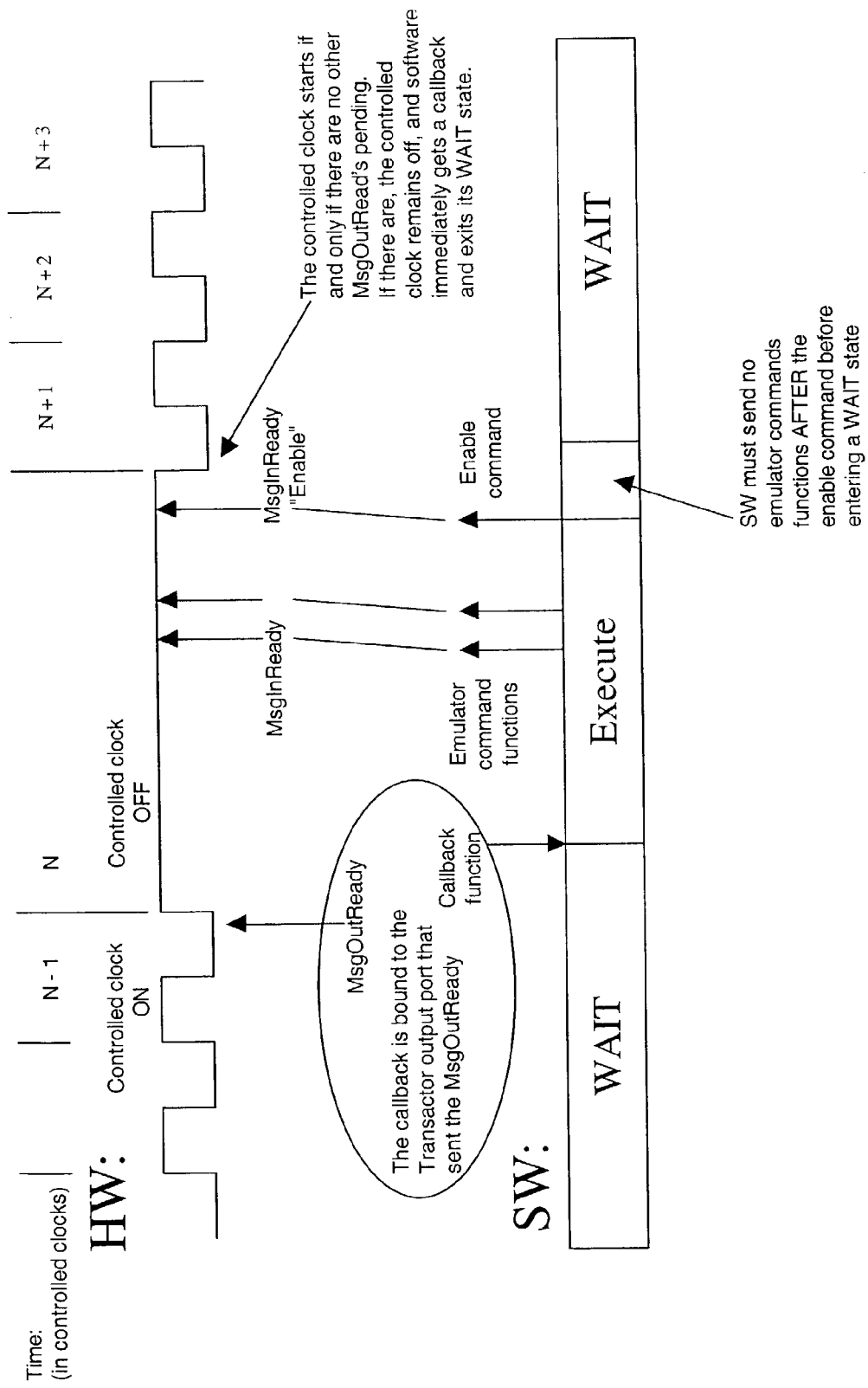
FIGS. 1F-1G illustrate timing diagrams of a deterministic emulator in accordance with an embodiment of the present invention.

The hardware that stops the CCLK clock must be accurate to one clock cycle. The application module 104 restarts the CCLK clock, since the hardware cannot determine when to do this on its own. These features enable operation of a deterministic channel controller, and are illustrated in FIG. 1F, in the form of a timing diagram.

Figure 1G:
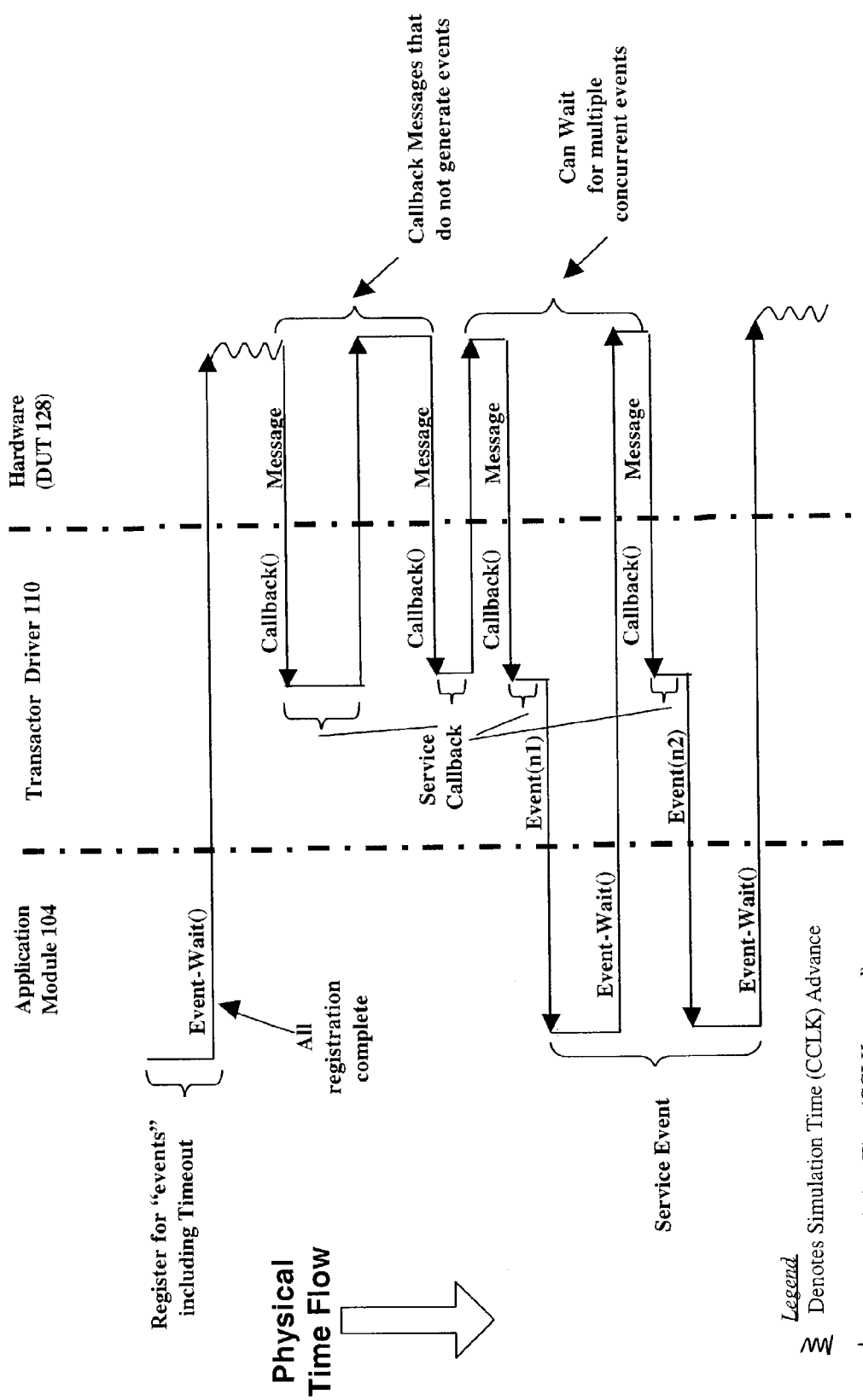

FIG. 1G is another illustration of the event-wait approach and zero simulation time servicing of events according to the present invention. In FIG. 1G, time flow is generally downward. As may be seen from FIG. 1G, the application module 104 creates a register for events triggered by emulator behavior, that may need to be serviced by either the transactor drivers 110 or the application module 104. The DUT 128, in response to commands from the application module 104, will generate a message with a callback upon passing of simulation time (i.e., clock cycles of CCLK). The response messages may be of two types: those that require servicing by the application module 104, and those that only require servicing by the transactor drivers 110. Both types of servicing occur within zero simulation time, as may be seen from FIG. 1G. In the event that servicing by the application module 104 is required, as determined by the transaction drivers 110, the event is generated, the application module 104 is notified, and the system enters an event-wait state, until the callback is serviced. This occurs in zero simulation time. When the event is serviced, the emulator is told to wake up again, and simulation time continues.

Figure 2:
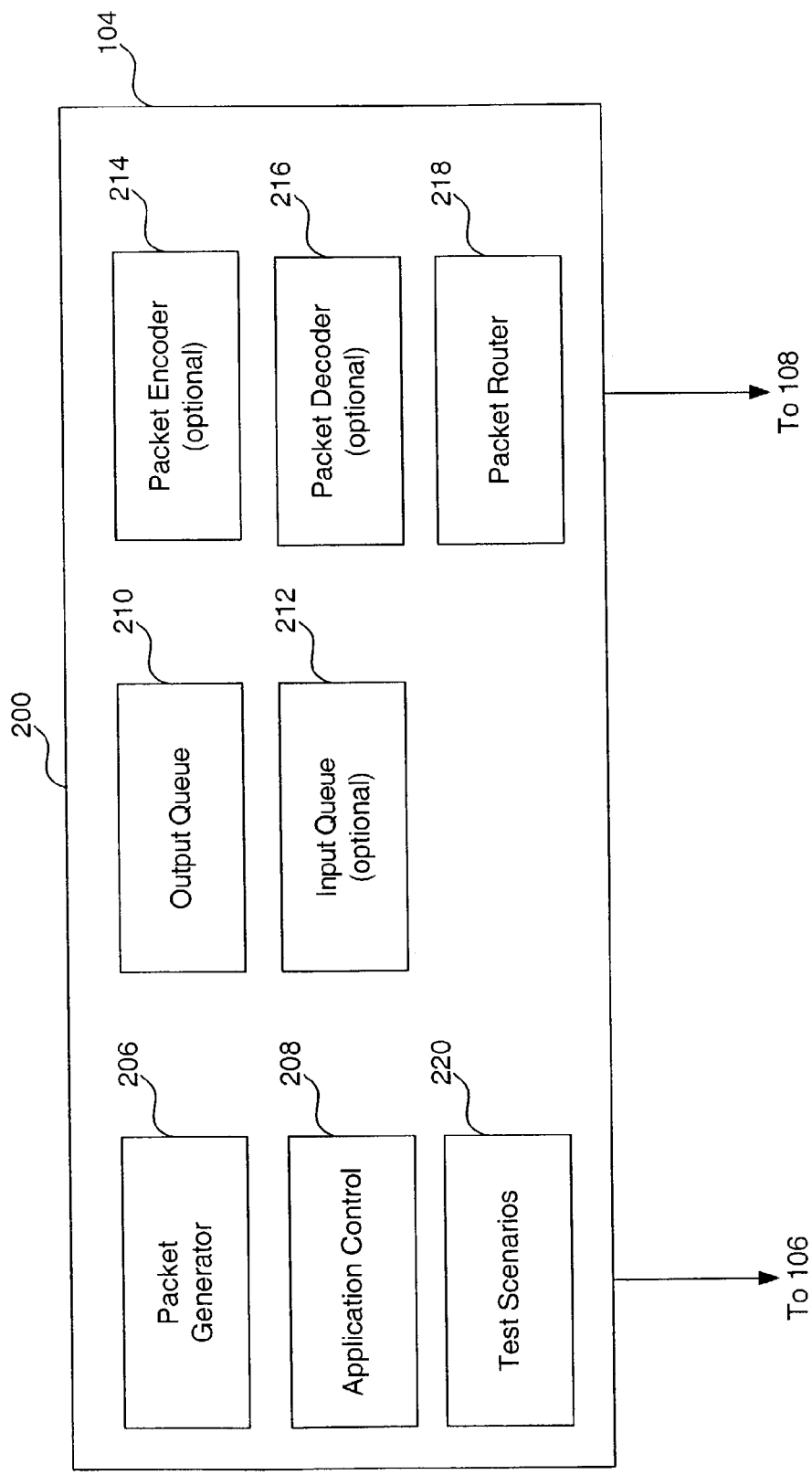
FIG. 2 shows a block diagram of an application module according to an embodiment of the present invention.

In FIG. 2, the various modules of the application module 104 are illustrated, according to one embodiment of the present invention. Module 104 can include a packet generator 206, an application control 208, an output queue 210, an input queue 212, a packet encoder 214, a packet decoder 216, a packet router 218, and a test scenarios module 220. The components of module 104 are described in additional detail in FIG. 5, discussed below.

The test scenarios 220 include the information that determines how the other components of the application module 104 are to be configured. In one embodiment, the test scenarios 220 are specialized based on the DUT 128. In an alternative embodiment, the test scenarios 220 are specialized based on the type of conditions that are being tested in the DUT 128. The queues 210 and 212, and coders 214 and 216 are instantiated based on the requirements of the test scenario 220 to forward and receive stimulus from the packet generator 206. The packet generator 206 generates the commands (i.e., stimulus for the DUT) based on the requirements of the test scenario 220. The application control 208 manages the modules of the application module 104, and ensures that the test scenario is properly executed. The packet router 218 tags and routes packets, both commands and returning events to the proper output and input queues 210-212. In an embodiment of the present invention, more than one of modules 210-216 are instantiated in the module 104.

Figure 3:
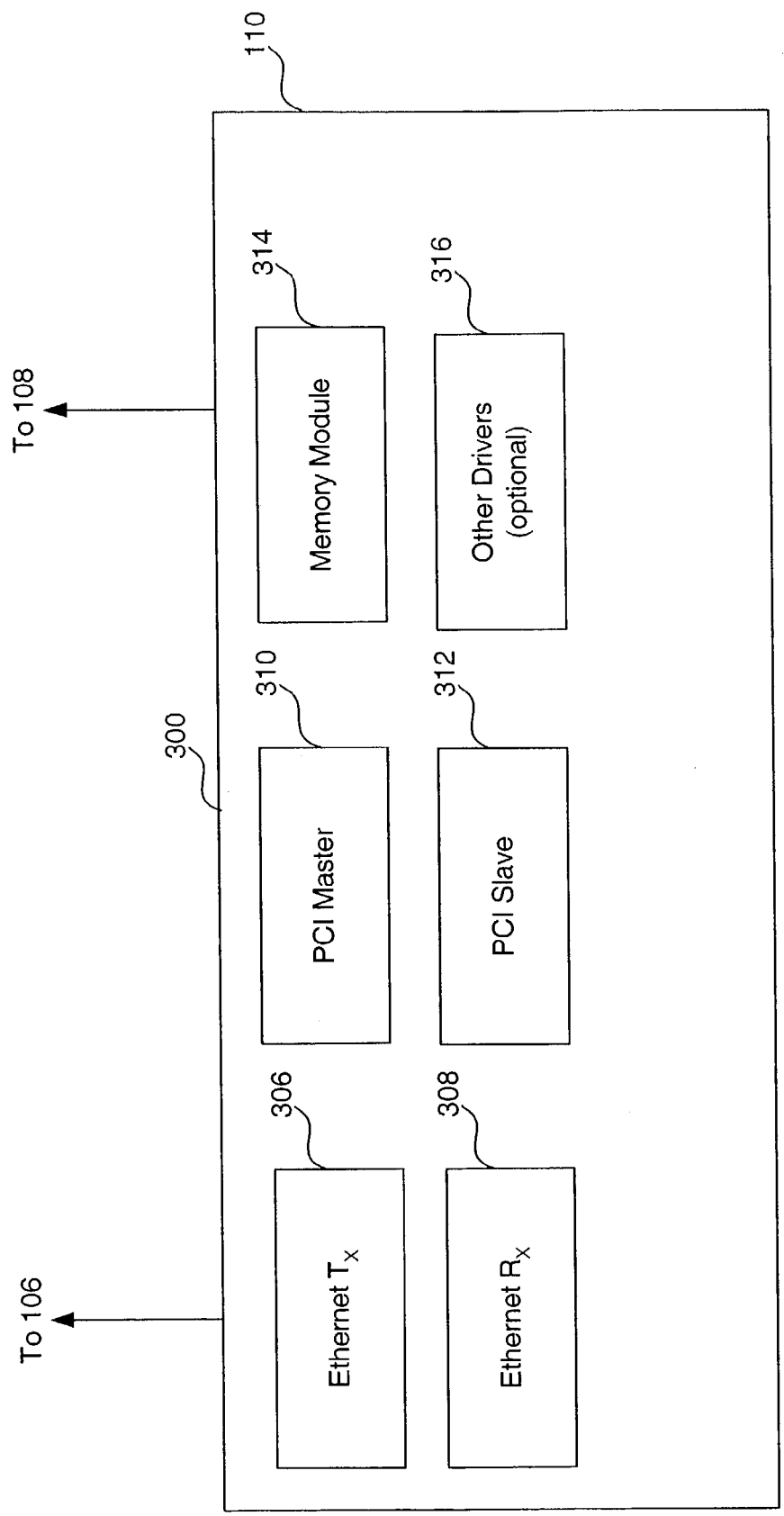
FIG. 3 shows a block diagram of transactor drivers according to an embodiment of the present invention.

In FIG. 3, according to an embodiment of the present invention, various transactors are shown. Ethernet transmit 306, Ethernet receive 308, PCI master 310, PCT slave 312, Memory module 314, and other drivers 316 are illustrated. These drivers represent various interface types that can be implemented as transactor drivers in module 110. These drivers provide the various modes of communication, utilizing specific APIs. These drivers are often determined based on the type of testing required and/or the type of design being tested, i.e., does the DUT include Ethernet, PCI and/or other components that either require testing and/or are required for testing. The memory module 314 provides an interface to external memory used by the DUT (such as a SDRAM).

Figure 4:
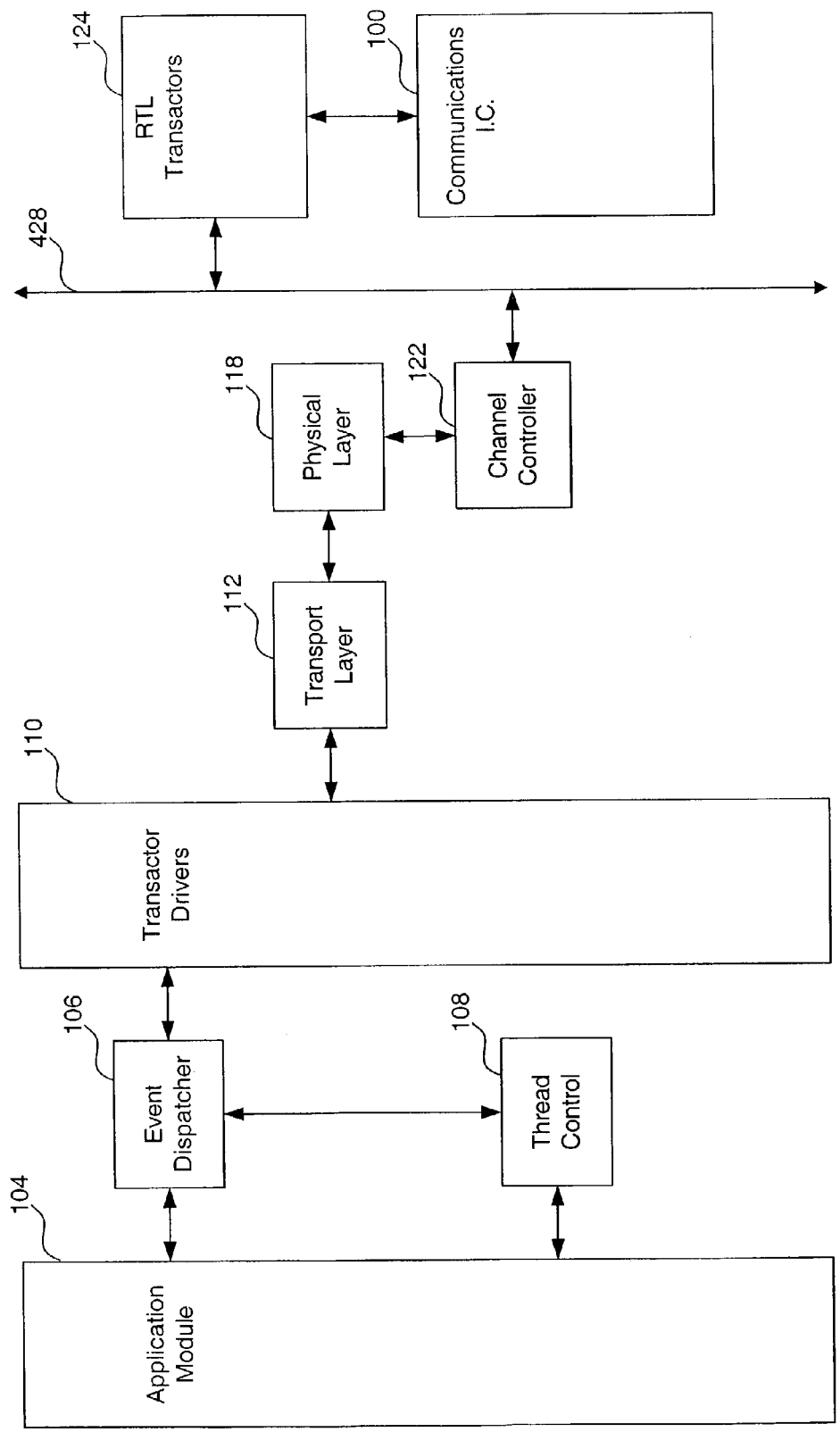
FIG. 4 shows a block diagram of a simulator according to an alternative embodiment of the present invention.

FIG. 4 shows the details of the transaction-based verification environment similar to the embodiment previously described in FIG. 1A, with similar components numbered the same as in FIG. 1A. In this embodiment, the software target system is built on top of a MCT transport layer and a physical communication layer connected to the channel controller 122. The channel controller 122 binds and synchronizes with each transactor to receive messages from the corresponding C driver(s), a unique logical communication channel. In an embodiment, the channel controller 122 provides clock control for multiple synchronous clocks.

Briefly, in FIG. 4, an application module 104 is in communication with an event dispatcher 106 as well as a thread control 108. The event dispatcher 106 is in communication with a transactor drivers module 110. The module 110 is in communication with a transport layer 112. The transport layer 112 is in communication with a physical layer 118. The physical layer 118 is in communication with a channel controller 122. The channel controller 122 is in communication with a bus 428. The bus 428 is in communication with one or more RTL transactors 124. The transactors 124 are in communication with the communications IC 100, which includes one or more DUT(s).

The software target system embodied by the application module 104 generates sequences of transaction stimuli, i.e., commands/data, that are designed to match real-world operations to the DUT. During verification, these stimuli are queued and scheduled by the modules 104, 106, and 108 for transmission to the DUT at specific times. The commands simulate the behavior of an actual system. In turn, transaction responses, i.e., events, from the DUT are received by the module 104. The events can be recorded for later review or viewed in real-time, i.e., after each set of commands generates a response. The results can be compared with expected or predicted responses.

The creation and maintenance of transactors 124 in the user environment is important. Transactors 124 can be developed in parallel with the hardware design in a software simulation environment. For example, the transport layer 112 and physical layers 118 are provided with a standard programmable language interface (PLI) which mimics the behavior of its hardware components. These PLIs can be used with standard hardware description language (HDL) simulators to run slow speed simulations of the system at the register transfer level (RTL). Once they are tested at this level, they can be compiled directly into an emulation environment.

This provides the capability of having a unified, structured co-modeling environment that uses software simulation for initial functional and timing verification of basic operation and emulation for exhaustive functional testing.

A number of SOC designs can be verified using the transaction-based verification environment of the present invention. Complete regressions can be run in less clock time than a single process in a continuous software simulation.

By raising the level of abstraction, transaction-based simulation allows more complete verification of the SOC and expands the verification possibilities, such as, in one embodiment, applying directed Monte Carlo techniques. With a software target system in place, application software developers with system-level modeling skills can directly contribute in the hardware verification. This provides an additional perspective on hardware verification by enabling software developers to build sophisticated verification scenarios without needing to understand the detailed hardware implementation.

Figure 5:
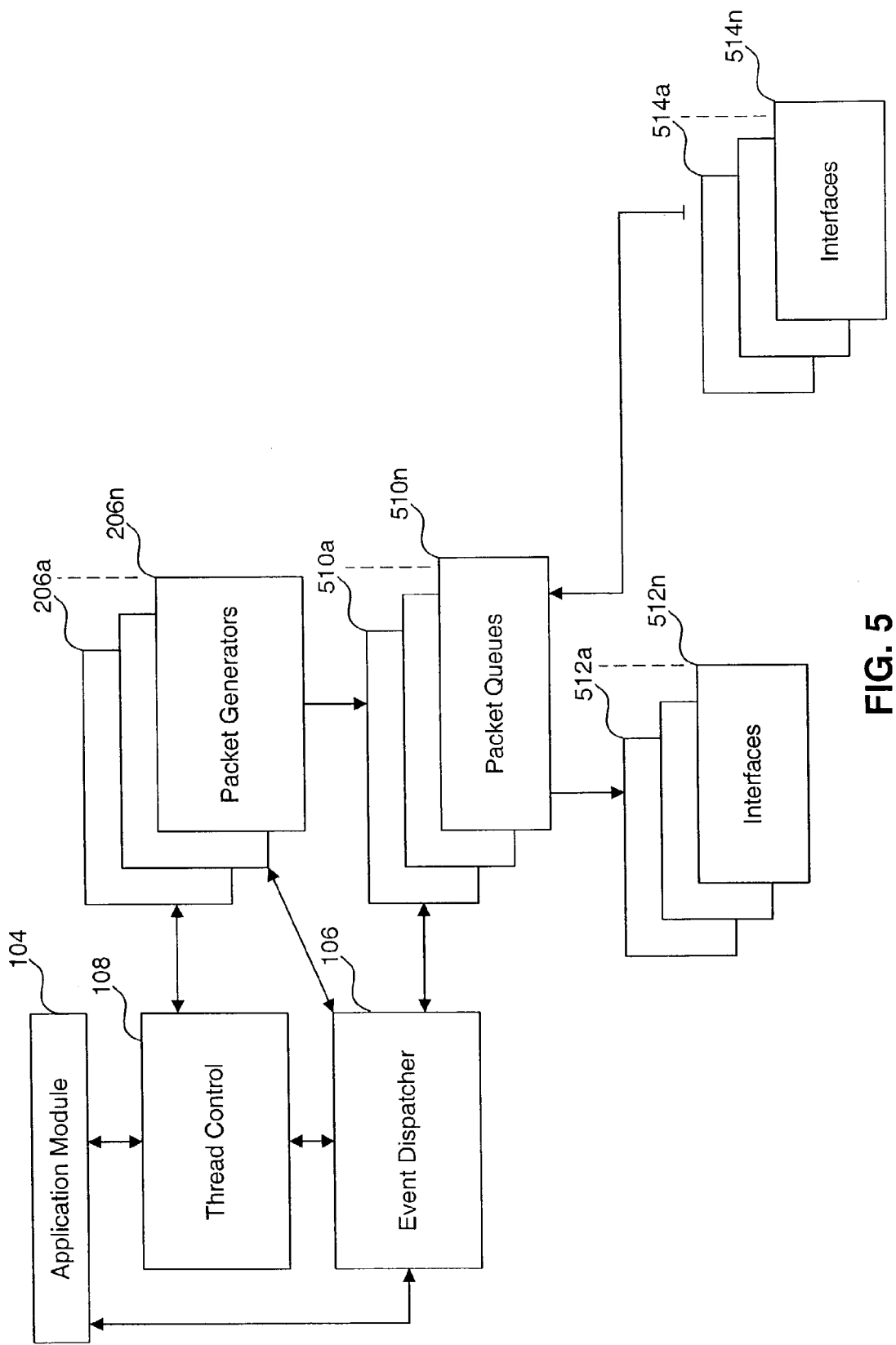
FIG. 5 shows a block flow chart of simulator components according to an embodiment of the present invention.

In FIG. 5, a block diagram illustrating the connectivity of the modules of the application module with other components of the system is displayed. Application module 104 is in communication with thread control 108 and event dispatcher 106. The application module 104 provides the test scenarios for the system. In one embodiment, the test scenarios are loaded onto their own module (module 220). The test scenarios can include the commands for the other modules of the system, as well as timing information and notification rules so that events, such as callback events, can be handled by the system.

These commands are forwarded to the thread control 108 and the event dispatcher 106. The thread control 108 initializes and verifies components of the system. The event dispatcher 106 registers objects for the test scenarios so that timed events will yield the proper callback event. The callback events, as described in additional detail elsewhere herein, provide confirmation that a specific condition in the DUT has occurred, i.e., an error condition or a successful end of process condition. The event dispatcher 106 provides, according to an embodiment of the present invention, a timer queue that provides the global clock for the system. The timer queue allows for discrete control of event_wait loops, and thus, control over the advancement of time within the system.

The modules 108 and 106 provide commands and clock advancement control, respectively, to packet generators 206a-206n, where n represents any number of packet generators. In one embodiment, threads are instantiated for testing in the system of the present invention by the creation of one or more of packet generators 206. The packet generators 206 are typically independent of each other and provide commands to the one or more packet queues 510a-510n (e.g., either output queue 210 or input queue 212). The packet queues 510a-510n can be configured to handle packets based on category, destination, or similar feature. In one embodiment, the packet queues 510a-510n can provide automatic verification of the commands.

The stimulus to the DUT is structured as commands and events, which are formed into packets and transmitted through the components of the present invention. While the present invention makes use of packets, it is not limited to forming and operating with stimulus only as packets. As one skilled in the relevant arts would recognize, based at least on the teachings herein, other forms of transport can be utilized.

The packet queues 510a-510n can be in communication with one or more sets of interfaces. A first set of interfaces 512a-512n can be in communication with the emulator and/or application module 104 and forward commands to the application module 104. A second set of interfaces 514a-514n can be in communication with the application module 104 and forward events from the application module 104 to the packet queues 510a-510n.

Transaction-Based Techniques of Embodiments of the Present Invention

During the process of developing the transaction-based verification environment, we discovered that there are several natural modes of operation.

Data Streaming

Dividing a transaction model into its C driver and RTL transactor is a design consideration of efficiently creating a system that provides for a maximizing of speed, maintainability, and flexibility. In some cases, it is effective and simpler to generate vectors in software and stream them directly to the emulator. This is particularly advantageous for users that want to use vector-based regressions in both simulation and emulation. Vectors can be algorithmically generated in C and created via other tools such as Matlab or can be real-life data captured with a recording device. Conversely, data streaming can also record data in a regular, periodic manner from the pins of a chip interface and send it back to C as vectors. Often, this data is simply put into a file and post-processed. Thus, data streaming and transaction simulation are important features of a verification system.

Memory Interfacing

Memory transactors can be multi-ported memories with ports connected to a transaction interface and other ports connecting to the SOC as standard memories, such as SDRAM, SRAM, EEPROM, and so on. From a high level C test bench, memory transactors improve the programmability of software. Memory models with transaction interfaces can be loaded and unloaded at very high speeds (e.g., up to speeds of approximately 64 Mbps).

In addition, tests for memory locations of conditions can be done at any time during the simulation run. In one embodiment, when the memory requirements are beyond the capacity of an emulation main memory, external RAM boards can be attached to the emulator using traditional in-circuit I/O connections. In this case, the memory transactor becomes a wrapper interface to these external memory boards. Various verification embodiments can be devised utilizing the access provided by memory transactors, i.e., memory that is external to the SOC as well as internal memories.

Loose Simulations

Front-end DUT verification has two main components: hardware design and software development. Usually both components can operate disjointedly throughout most of the project. This is because the hardware design can run bounded test cases on the DUT implementation, and the software development can provide applications and firmware by using abstract software models of the DUT.

Nevertheless, at some point the software side removes these abstract models and tests the application code and firmware against the DUT. In some cases, if prototyping or in-circuit emulation is not used, this usually occurs with the delivery of the first silicon. Transaction-based verification can bring both sides together sooner, so the actual firmware and software application or portions of the application (depending on the size and complexity) can be run with a system before the DUT is available in silicon form. This allows for hardware changes to fix overall system problems found in software integration.

Typically, during the software verification stage, testers are more concerned about running their applications on a real asynchronous system. Simulation determinism has not been as important as raw speed during this part of the verification cycle, since checking specific corner cases in the hardware is not the primary objective. Verifying the software is the primary objective, so loosely coupled behavior that can give a close approximation to the real system is the preferred mode of operation for transaction-based environments.

A transaction-based environment of an DUT design with a CPU core running a real-time operating system (RTOS) provides benefits to software verification. A virtual prototype of the SOC can be provided and a programming interface for it developed.

According to one embodiment of this transaction-based environment, a set of transactors can be developed. Memory transactors can be used to pre-load data and instruction sets prior to the start of simulation and also to peek and poke into memory during simulations. A UART transactor can be used that allows interaction with the RTOS through a terminal window. This allows testing the DUT and software code prior to either tape-out or other processing. Actual diagnostics can be debugged (e.g., at the source level, as described elsewhere herein) and can run prior to any real silicon availability. In essence, the environment provided by the present invention yields the software and hardware for an executable verification of a specification on system running actual code.

Deterministic Simulations

During hardware verification, simulation runs need to be completely deterministic for designers to isolate failures. Software simulators work this way because of their single thread of execution. If separate processes are used (such as a PLI), the inter-process communication takes place in zero simulation time, leaving the sequence of simulation events deterministic. Parallel processes are running, one in the emulator and one or more in the software of the simulator. Thus, indeterminate behavior is possible between separate runs of the same simulation due to the varying relative speeds and process execution in the multi-tasking operating system (e.g., Unix).

The present invention provides for multiple threads of execution, as described herein. In one embodiment, deterministic operation prevents the emulator from running at the same time as the simulator. The exception to this rule is, when running, the application module does not send an asynchronous command or input to the running emulator that causes a change of state to the DUT (e.g., loading a transactor memory buffer that is almost empty). When the software and emulator are running concurrently and the application module sends a transaction to the emulator, there is no way of knowing at what absolute time that transaction arrived at the DUT, and determinacy is lost. Therefore, the ability to accurately start and stop the emulation clock is an approach to implementing deterministic behavior. The event dispatcher 106 and channel controller 112 modules can provide this clock control when using a compliant API/PLI.

While determinism enhances process control, there is a reduction in the overall system speed from stopping the emulator clock. Exemplary embodiments have shown that operating in fully deterministic mode can reduce speed to about half the maximum given by the emulation clock speed if the clock is left free running (i.e., the extreme loosely-coupled case).

The transaction-based verification environment does not require determinism, but as the following example shows, it can be implemented to identify errors. For example, in one embodiment, during the verification of a DUT design, a strange behavior may be recorded in one of the first-in first-out buffers (FIFOs) during real-time verification. Managing this behavior can be impossible, since the particular failure/outcome may not be easy to repeat. In a deterministic system in accordance with an embodiment of the present invention, the failure can be quickly identified and fixed after at least two runs: one run to find out when in time the error occurred; and the second run to record the data for corrective purposes.

Hardware Assisted Transaction-Based Performance

Speed is an important factor in verification, but it often ranks behind determinism. Where one could achieve less than a second of real-time operation through software simulation, transaction-based simulation allows one to deterministically run several minutes of real-time operation. In general simulation, speeds can be bounded by the software running on the workstation and not by hardware speeds. This is a switch from traditional software simulation where test bench C software is much faster than the simulation software.

The availability of virtually unlimited verification cycles has a profoundly positive impact on verification strategy. With traditional verification methodologies, one can typically create test cases designed to optimize as much functional coverage as possible within a given number of available verification cycles. With this constraint removed, one can create and run tests that were not previously possible. Accordingly, this significantly increases the amount of verification that can be done as well as the functional coverage that can be obtained.

Transaction-based verification unites disparate design areas including system architecture, RTL design, system integration, and software engineering. It integrated these areas early in the development process. System architecture can receive implementation feedback of the overall system functionality during the RTL verification phase. RTL design can augment their targeted block/SOC-level hardware tests with random or exhaustive testing techniques. System integration has a very powerful tool to verify silicon with real world tests, and then debug potential failures by running those real world tests in a transaction-based environment. Software engineering can work with the hardware design on software/hardware integration before a prototype is available. All of this provides the tools to build quality systems on schedule.

By providing orders of magnitude of improvement in verification performance, transaction-based verification changes the nature of SOC verification. Transaction-based verification facilitates integration of software code and hardware design by allowing for system level verification and characterization of the complete system. Most importantly, by providing comprehensive visibility into system-level functionality before a tape-out, it offers an effective verification solution for uncovering the hidden corner case conditions in highly integrated SOC designs: eliminating expensive silicon re-spins and time-to-market delays.

Example SOC Embodiment

The system-level verification challenges described herein prompted the development of the transaction-based methodology of the present invention. This methodology allows C models running in a workstation to communicate with the design under test (DUT) running in an emulator. This methodology can dramatically improve the verification capabilities for next-generation devices.

Figure 6:
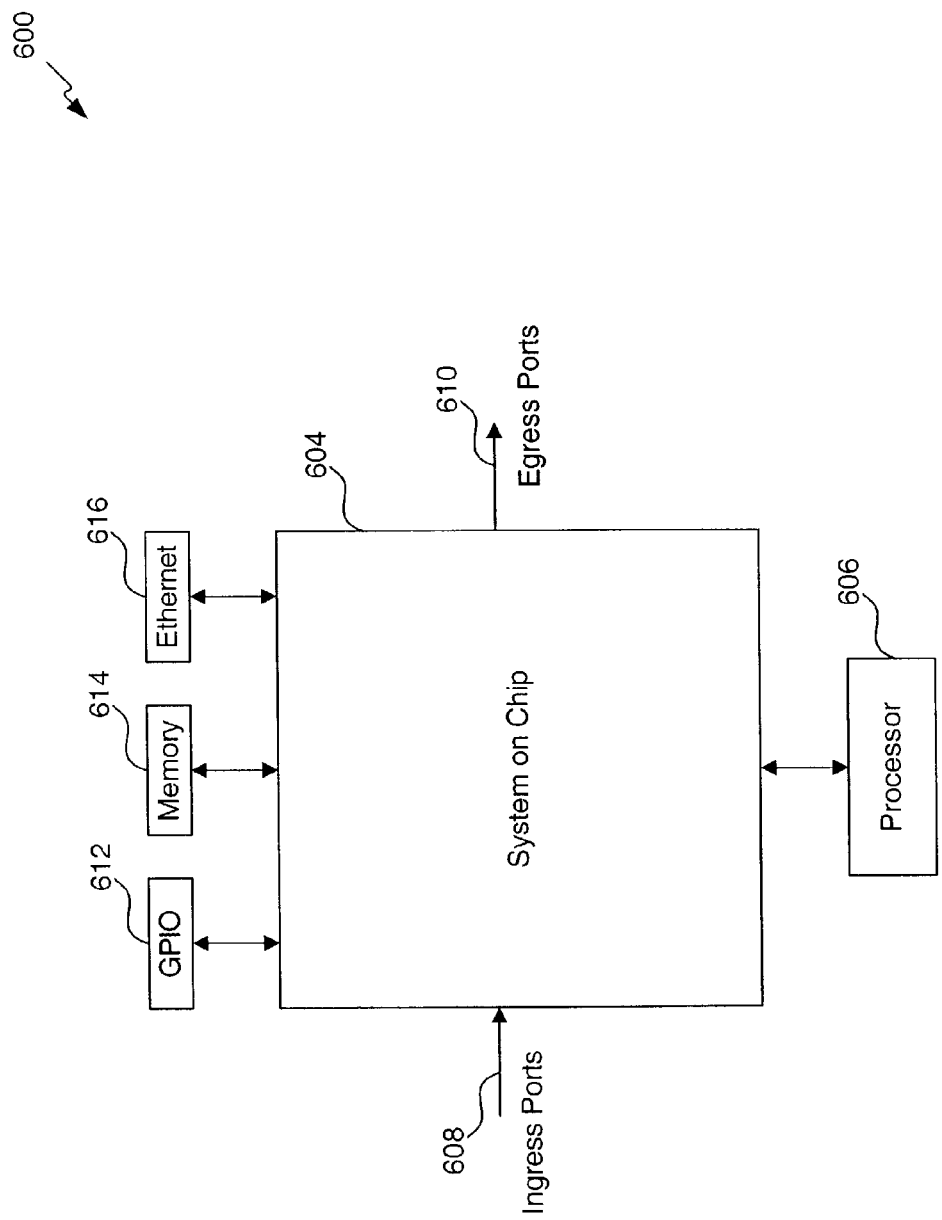
FIG. 6 shows a block diagram of a system on chip (SOC) according to an embodiment of the present invention.

In simulation environments, packets of data are input through one or more interfaces, processed by the ASIC, and then output on other interfaces. FIG. 6 shows an example of such an ASIC with a few standard interfaces connected to the DUT. In FIG. 6, a DUT 604 includes ingress ports 608 and egress ports 610. Ports 608 and 610 allow for the transport of the packets of data through the system. Processor 606, general purpose I/O (GPIO) 612, memory 614, and Ethernet 616 are optional components that provide the DUT with additional testing functionality.

Simulation scenarios, typified in FIG. 6, are built to test as many critical corner cases as possible. These check at the block and ASIC level. Once the data path and corner-cases are checked at the functional and timing level, the ASIC is considered verified. In one embodiment, this type of design increases in size, increased verification requirements can be met by sending the additional simulations to a simulation farm.

With today's highly integrated DUT designs, a difficult verification problem arises when complex control and state machines are present. The methods described herein for ASIC verification checks this complex data flow, as well as the corner-cases of DUT design.

The number of corner-cases at the DUT level is often too difficult to compute. As a result, the DUT can fail once an illegal state is reached. This can happen at any time and is extremely difficult to debug in silicon. The level of verification required finding this type of failure is usually not attainable with traditional simulation methods, because of the hundreds of millions of cycles required to provoke these types of errors.

To complicate matters, generating the stimulus (i.e., the commands) to find the hidden corner-cases is very difficult. At least three solutions are available to solve this problem. The first is to keep track of all state machines in the DUT, and make sure each state and state transition is hit during the verification process. Once all states and combination of states are verified, the design is comprehensively tested. Unfortunately, creating an environment to keep track of these states imposes severe restrictions on RTL designers.

The second solution is to use a prototype or in-circuit emulation of the DUT. This verification method almost always guarantees functional operation of the first silicon, but requires effort to build a target board, slow down the target system interfaces, and locate it in an asynchronous environment (non-deterministic checking). In some cases, like those where the DUT is part of a new system whose other parts are in development, it is not possible to build a target board.

A third solution is to use software to pseudo-randomly stimulate the DUT in a transaction-based emulation environment. The controlled stimulus and collection of data in and out of the system verifies the DUT design as if operating in the real system. As the stimulus arrival times are throttled and actual data varied, the hidden corner-cases fall out. This method requires creating an interactive C-level verification environment, specifically a transaction-based solution.

To implement the environment, application developers build software target systems directly coupled to emulation through a physical layer API using standard GNU C and C++ tools. The software target system provides control, configuration, and stimulus from a C-level test bench via high-level, standard transaction interfaces.

Transaction interfaces or transactors can have two parts: a C driver and an RTL transactor. By calling the C driver from the software target, pseudo randomly generated traffic scenarios are played and compared against the DUT implementation at a high level of abstraction. Utilizing a modular, object-oriented suite of data generators, queues, event handlers, and result checkers, the application software allows for the creation of verification scenarios that quickly uncover illegal states and hidden corner cases.

RTL transactors can be designed for standard platforms/protocols such as Ethernet and PCI (as well as custom transactors). RTL transactors can be created for each distinct DUT interface, and compiled into the emulator with the DUT design. These RTL models convert transactions into the pin level accurate I/O of the DUT. For example, a PCI burst read transaction would generate a complete, functionally accurate bus protocol performed by the RTL transactor. According to embodiments of the present invention, the transaction interfacing described herein has the benefit of reducing communication between the workstation and emulator, and allowing the emulator to run for multiple clock cycles at a time. Both of these factors can yield improved verification performance.

Figure 7:
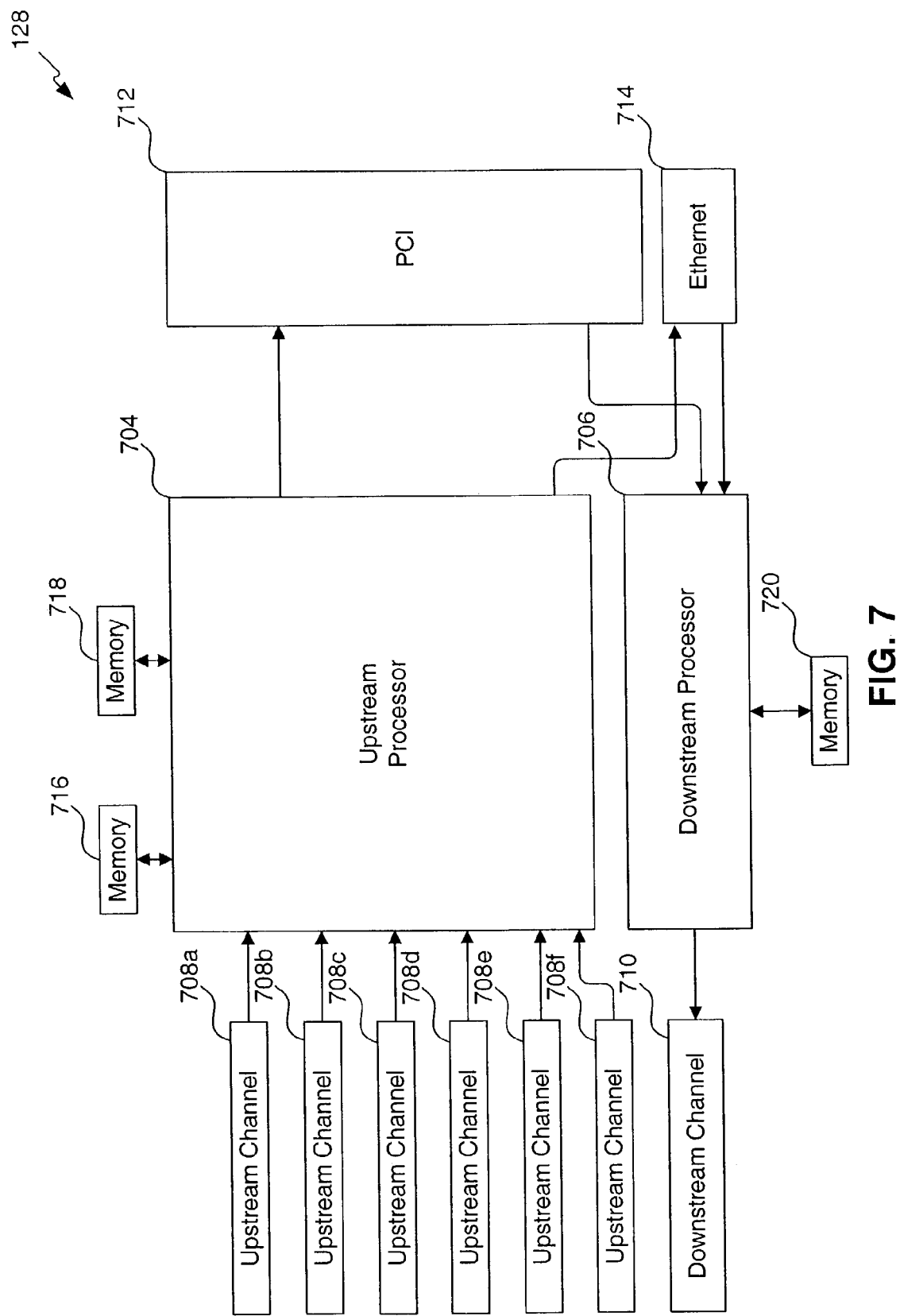
FIG. 7 shows a block diagram of an example DUT showing exemplary components according to an embodiment of the present invention.

FIG. 7 shows a block diagram of an example DUT 128 showing exemplary components according to an embodiment of the present invention. In DUT 128, an upstream processor 704 and downstream processor 706 are in communication with various components of the present invention. The upstream processor 704 is in communication with several upstream channels 708a-708e. The upstream channels 708a-708e provide incoming data to the processor 704.

Memory modules 716 and 718 are also in communication with the processor 704 and provide storage and/or buffering capability to the processor 704. PCI module 712 and Ethernet module 714 are in communication with the processor 704. The modules 712 and 714 are also in communication with the downstream processor 706. The PCI module 712 provides a PCI interface between the upstream processor 704 and the downstream processor 706. The Ethernet module 714 provides an Ethernet interface between the upstream processor 704 and the downstream processor 706. A memory module 720, similar to the memory modules 716 and 718 is in communication with downstream processor 706, and provides storage and/or buffering capabilities. The downstream processor 706 is in communication with at least one downstream channel 710.

In one embodiment, the operational flow of data involves the data being forwarded to the upstream processor 704 via the upstream channels 708a-708e. The processor 704 then processes the data. During processing, the processor 704 is able to access the memory modules 716 and 718. Post-processed data is forwarded through either or both of modules 712 and 714 to the downstream processor 706. The downstream processor 706, with access to memory module 720, can further process the post-processed data before forwarding it to downstream channel 710.

Figure 8A:
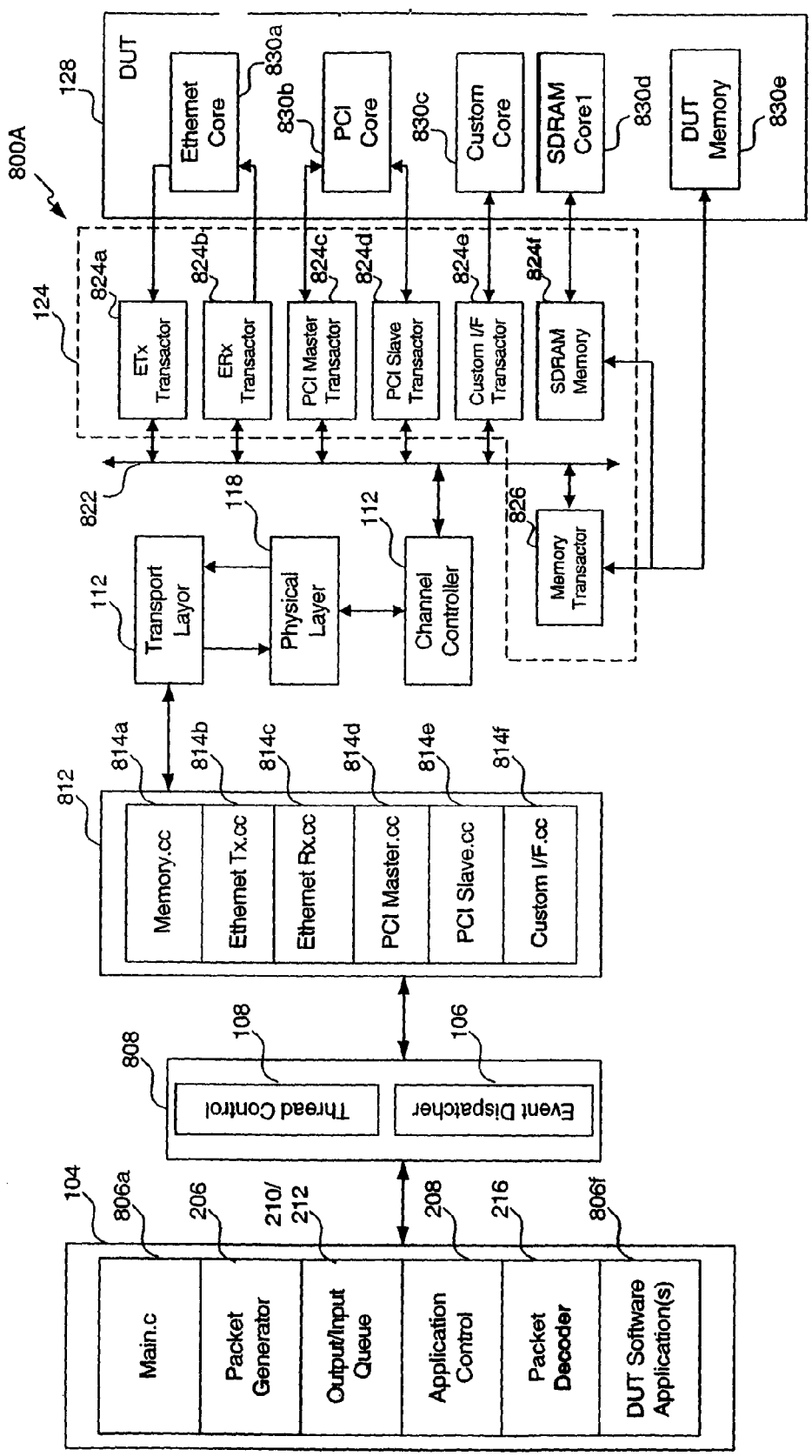
FIG. 8A shows a block diagram of an example DUT testing system, based on the design of FIG. 7 in a common memory transactor implementation, and related simulator components according to an embodiment of the present invention.

FIG. 8A shows a block diagram of an example DUT testing system 800A, based on the design of FIG. 7 in a common memory transactor implementation, and the related simulator components according to an embodiment of the present invention.

In system 800A, the application module 104 can include a number of modules, as described in other embodiments herein. Main.c module 806a includes the operating logic for the application module 104. Packet generator 206 receives commands from both an application control 208 and DUT software application(s) 806f (described below), and generates the appropriate packets. The packets are forwarded to the appropriate queues 210/212. The queues 210/212 forward the packets to the modules of the thread control and event API 808, described below. The application control module 208 instantiates and configures the components of the system 800A based on the requirements and/or parameters of the test scenarios defined by the DUT software application(s) 806f. The packet decoder 216 is an optional component that can decode, and in some embodiments, encode (as described above with respect to a packet encoder), the packet received from the packet queues 210/212.

The thread control and event API 808 can include a thread control module 108 and an event dispatcher 106. As described elsewhere herein, the thread control 108 handles the scheduling of events and forward commands to the packet generator 206. The event dispatcher 106 controls the event_wait loop state, object registration, and receives events, such as callback events from the other components of system 800A. The thread control and event API 808 are in communication with the driver API layer 812.

In one embodiment, the driver API layer 812 includes numerous drivers including, but not limited to, memory.cc 814a, Ethernet Tx.cc 814b, Ethernet Rx.cc 814c, PCI master.cc 814d, PCI slave.cc 814e, and Custom I/F.cc 814f. The memory.cc 814a is a shared memory area for the transactor drivers of the driver layer 812. The other drive modules provide the driver services for which they are named. For instance, drivers 814b and 814c provide transmit and receive Ethernet services, respectively. Similarly, drivers 814d and 814e provide PCI services. The custom I/F.cc driver 814f provides customized driver services based on the specifications of the DUT software application(s) 806f. In an embodiment, the driver 814f is not instantiated.

The driver layer 812 is in communication with a transport layer 112. The transport layer 112 is in communication with a physical layer 118. In one embodiment, stimulus is transported between the software centric components and the hardware centric components. The physical layer 118 is in communication with a channel controller 122.

The channel controller 122 allows for deterministic operations in the system by working in conjunction with the application module 104, and layer 808, to provide clock advancement and latency counter features at the hardware level. In an embodiment, the channel controller 122 includes the ability to control the clock cycles in the DUT 128. In another embodiment, the channel controller 122 operates with the DUT 128 as a primary transactor. The channel controller 122 is in communication with the channel controller bus 822.

The bus 822 is in communication with one or more transactors 124. In one embodiment, an Ethernet Tx transactor 824a, Ethernet Rx transactor 824b, PCI master transactor 824c, PCI slave transactor 824d, Custom I/F transactor 824e, and Memory transactor 826 are in communication with the bus 822. This configuration can be called a common memory transactor embodiment because the memory transactor 826 is in communication with a SDRAM memory module 824f and DUT memory module 830e. The memory transactor 826 providing memory transaction functionality for both these modules.

The transactor modules 124 are in communication with the DUT cores 830 within the DUT 128. In one embodiment, one or more of the DUT cores 830 can be located external to the DUT 128, such as, for example, when modules that relay data to one or more external cores are being tested in the DUT 128.

The Ethernet transactor Tx 824a and Ethernet transactor Rx 824b are in communication with an Ethernet core 830a within the DUT 128. Test signals are delivered to the core 830a by the transactor 824b, processed by the core 830a, and the post-processed data forwarded to transactor 824a. In one embodiment, when an error condition is shown in the post-processed data, the transactor 824a forwards a callback event to the channel controller 122 which in turns forwards it back to the application module 104.

The PCI transactor modules 824c and 824d are in communication with a PCI core 830b. The PCI core 830b operates in a similar fashion as the core 830a, providing processing of data. In one embodiment, however, as the PCI architecture demonstrates, both the master and slave transactors transmit and receive data.

A custom I/F transactor 824e is in communication with a custom core 830c.

The SDRAM memory 824f is in communication with the SDRAM core1 830d of the DUT 128. The core 830d provides for the testing of the DUT's memory design. As previously mentioned, the DUT memory 830e can be included within the DUT 128 and provides memory access with the DUT 128.

Figure 8B:
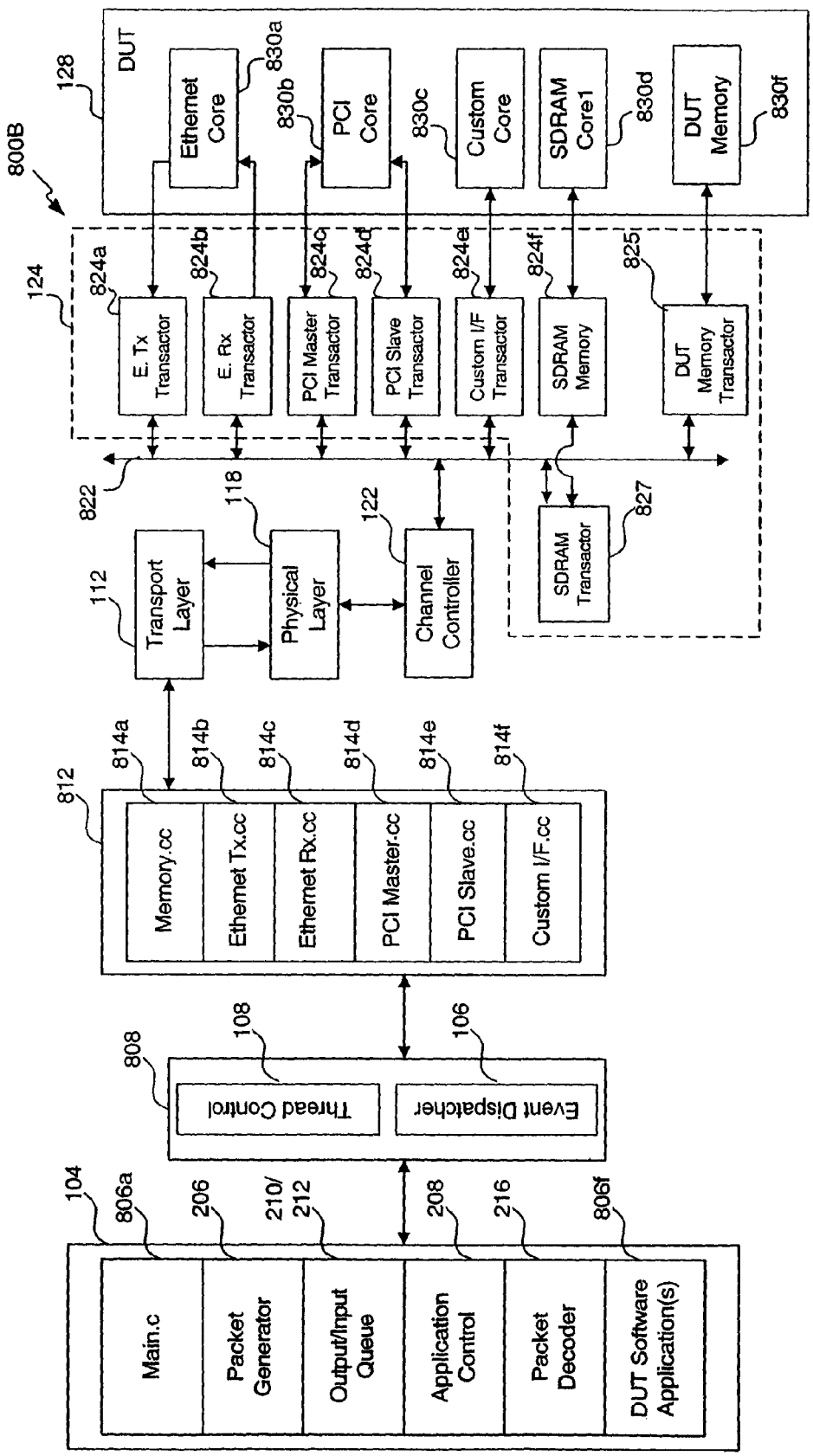
FIG. 8B shows a block diagram of an example DUT testing system, based on the design of FIG. 7 in an individual memory transactor implementation, and related simulator components according to an embodiment of the present invention.

FIG. 8B shows a block diagram of an example DUT testing system 800B, based on the design of FIG. 7 in an individual memory transactor implementation, and the related simulator components according to an embodiment of the present invention.

The individual memory transactor embodiment of system 800B is equivalent to the system 800A with the following modifications to the transactors and the DUT 128. The memory transactors are reconfigured such that the DUT memory 830f and SDRAM memory 824f are no longer in communication with the memory transactor 826. In the embodiment as shown, the transactor 826 is replaced with transactors 825 and 827 which directly interact with the respective modules. The SDRAM memory 824f is in communication with the SDRAM transactor 827, which is in communication with the bus 822. The DUT memory 830f is in communication with the DUT memory transactor 825, which is in communication with the bus 822.

Figure 9:
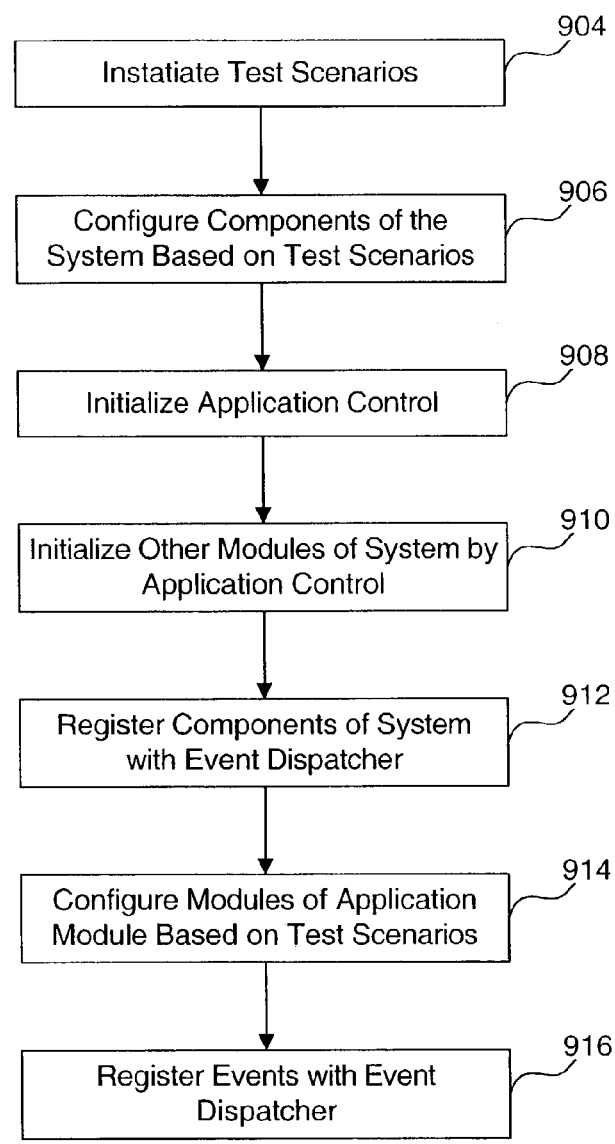
FIG. 9 illustrates a flow chart for a routine for initialization according to an embodiment of the present invention.

FIG. 9 illustrates a flow chart 900 for a routine for initialization according to an embodiment of the present invention.

In step 904, the test scenarios are instantiated in the application module 104. The test scenarios can include configuration information for the application control to utilize in configuring the system of the present invention. The routine then proceeds to step 906.

In step 906, the test scenarios provide for the configuration of the components of the system of the present invention. These components can include the application control module 208, as well as the event dispatcher 106 and/or thread control module 108. The routine then proceeds to step 908.

In step 908, the application control module 208 is initialized with the commands to be provided to the DUT 128. The application control module 208 can also include the other commands for components of the system of the present invention, e.g., one or more transactors 124, memory modules, or core modules located external to the DUT 128. The routine then proceeds to step 910.

In step 910, the application control module 208 initializes the other remaining modules. These modules can include the packet generator 206, queues 210, 212, decoders 216, and other components of the system that take their timing from the application control module 208. The routine then proceeds to step 912.

In step 912, the event dispatcher 106 receives registrations from the other components of the system so that it can properly forward commands to the packet generator(s) 206. The routine then proceeds to step 914.

In step 914, the test scenarios are used to configure the modules of the application module 104, such as the packet generator 206 and packet queues 210, 212, with the commands that they will be processing and forwarding to the interfaces of the present invention. The routine then proceeds to step 916.

In step 916, the event dispatcher 106 is provided with the events for which it is to monitor the system for. The routine terminates.

Figure 10:
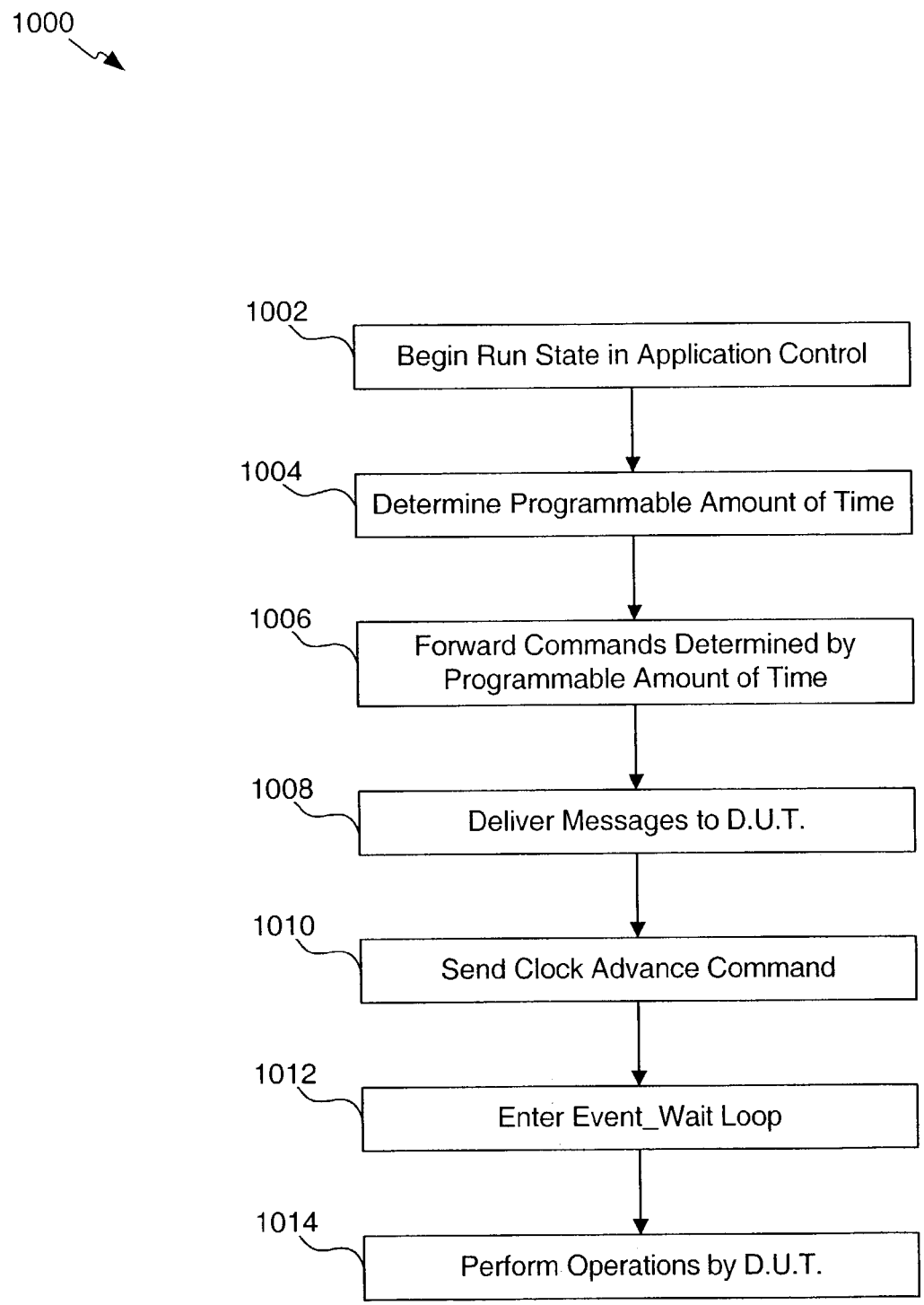
FIG. 10 illustrates a flow chart for a routine for stimulus delivery according to an embodiment of the present invention.

FIG. 10 illustrates a flow chart 1000 for a routine for stimulus delivery according to an embodiment of the present invention.

In step 1002, the system enters a run state command from the application module 104. The modules and components of the system begin operations at this point. The routine then proceeds to step 1004.

In step 1004, the application control determines, based on the test scenario, the amount of programmable time to operate the system in a run state. The routine then proceeds to step 1006.

In step 1006, commands are forward by the application control. These commands are determined based on the programmable amount of time. In one embodiment, the test scenarios forward the selected commands to the thread control module 108 for delivery to the packet generators 206. The routine then proceeds to step 1008.

In step 1008, the processed commands are delivered as messages, e.g., one or more packets of data, to the DUT 128. The routine then proceeds to step 1010.

In step 1010, the event dispatcher 106 sends a clock advance command, which is paralleled in hardware by the channel controller 122 to the DUT 128. The routine then proceeds to step 1012.

In step 1012, the event dispatcher then holds the software systems with an event_wait loop. The routine then proceeds to step 1014.

In step 1014, the DUT 128, having received the message and being advanced in time, beings to perform operations.

Figure 11:
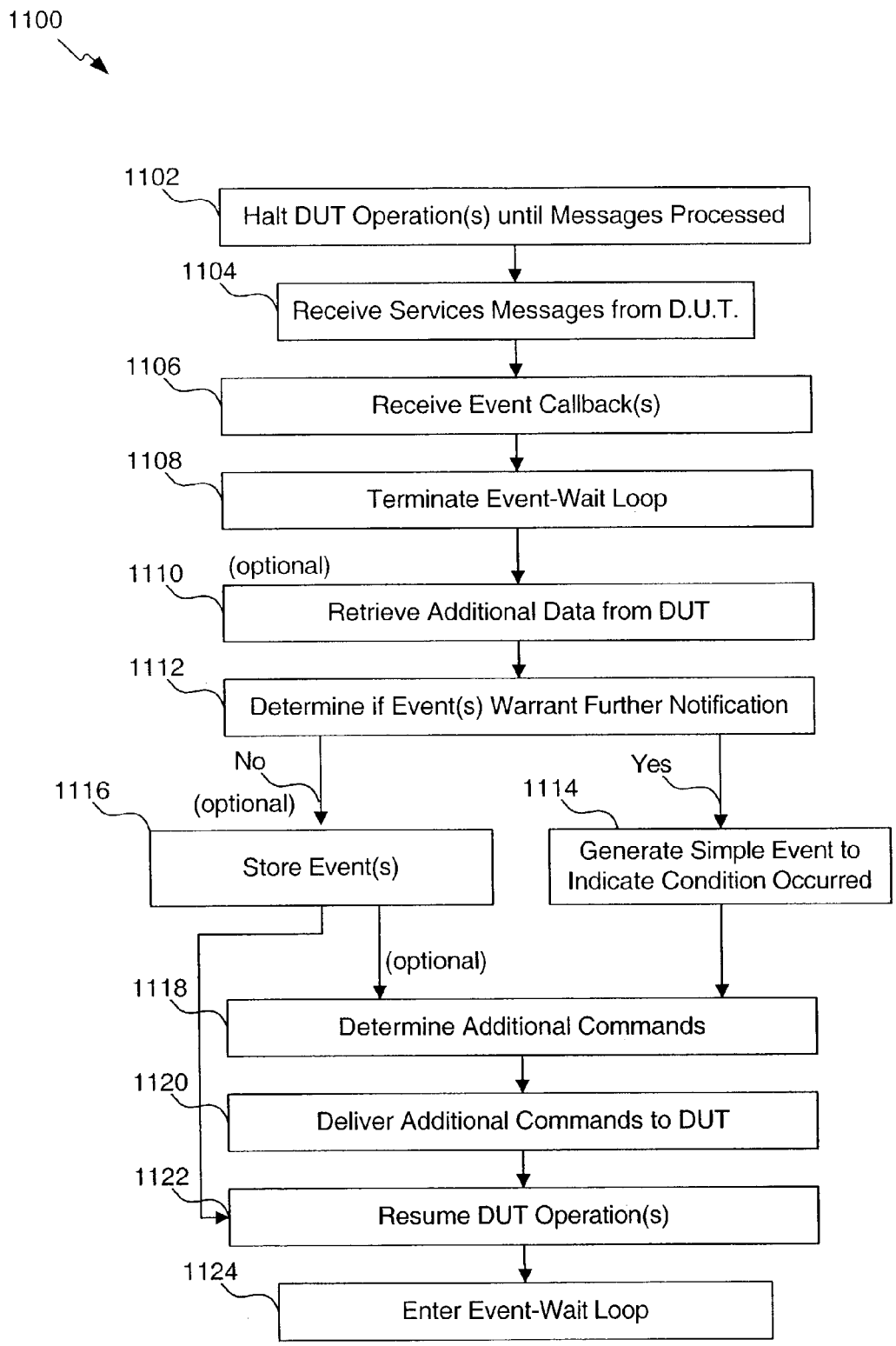
FIG. 11 illustrates a flow chart for a routine for stimulus recovery according to an embodiment of the present invention.

FIG. 11 illustrates a flow chart 1100 for a routine for stimulus recovery according to an embodiment of the present invention.

In step 1102, the reception of data messages from the DUT 128 causes the system to halt the DUT's operations so that the data messages, which can include one or more events, is processed. In one embodiment, the channel controller 122 halts the DUT 128 and forwards the messages to the thread control 108 and event dispatcher 106 modules. The routine then proceeds to step 1104.

In step 1104, the application module 104 receives the messages from the DUT 128. These messages include information about the services being performed by the DUT 128 and can include one or more events. The routine then proceeds to step 1106.

In step 1106, the messages are processed and any callback events are received. The callback event is, according to an embodiment of the present invention, a message informing the application module 104 that a specific condition exists or has occurred in the DUT 128. The routine then proceeds to step 1108.

In step 1108, the reception of the data messages causes the system to terminate the event_wait loop and begin processing the messages and any events. In one embodiment, the events can trigger the application module's delivery of further stimulus to the DUT 128. The routine then proceeds to step 1110.

In step 1110, the application module 104 can optionally retrieve additional data from the DUT 128. In one embodiment, the operations of the DUT 128 can produce data as the result of calculations or the interaction of the various components of the DUT 128. The data generated by these activities can also be useful in the verification process. The routine then proceeds to step 1112.

In step 1112, the system determines if the event(s) warrant further notification to other components of the system. If yes, the routine then proceeds to step 1114. In no, the routine then proceeds optionally to step 1116.

In step 1114, the system generates a simple event to those components to indicate that a condition has occurred or is present in the DUT 128. The routine then proceeds to step 1118.

In step 1116, the system can optionally store the event(s), data and/or stimulus so that further processing can occur offline and external of the system. Optionally, the routine then proceeds to step 1118. Otherwise, the routine then proceeds to step 1122.

In step 1118, the application module 104 determines additional commands to be delivered to the DUT 128. The routine then proceeds to step 1120.

In step 1120, any additional commands are delivered to the DUT 128. The routine then proceeds to step 1122.

In step 1122, the DUT 128 resume operations. The routine then proceeds to step 1124.

In step 1124, the system enters the event_wait loop.

Figure 1H:
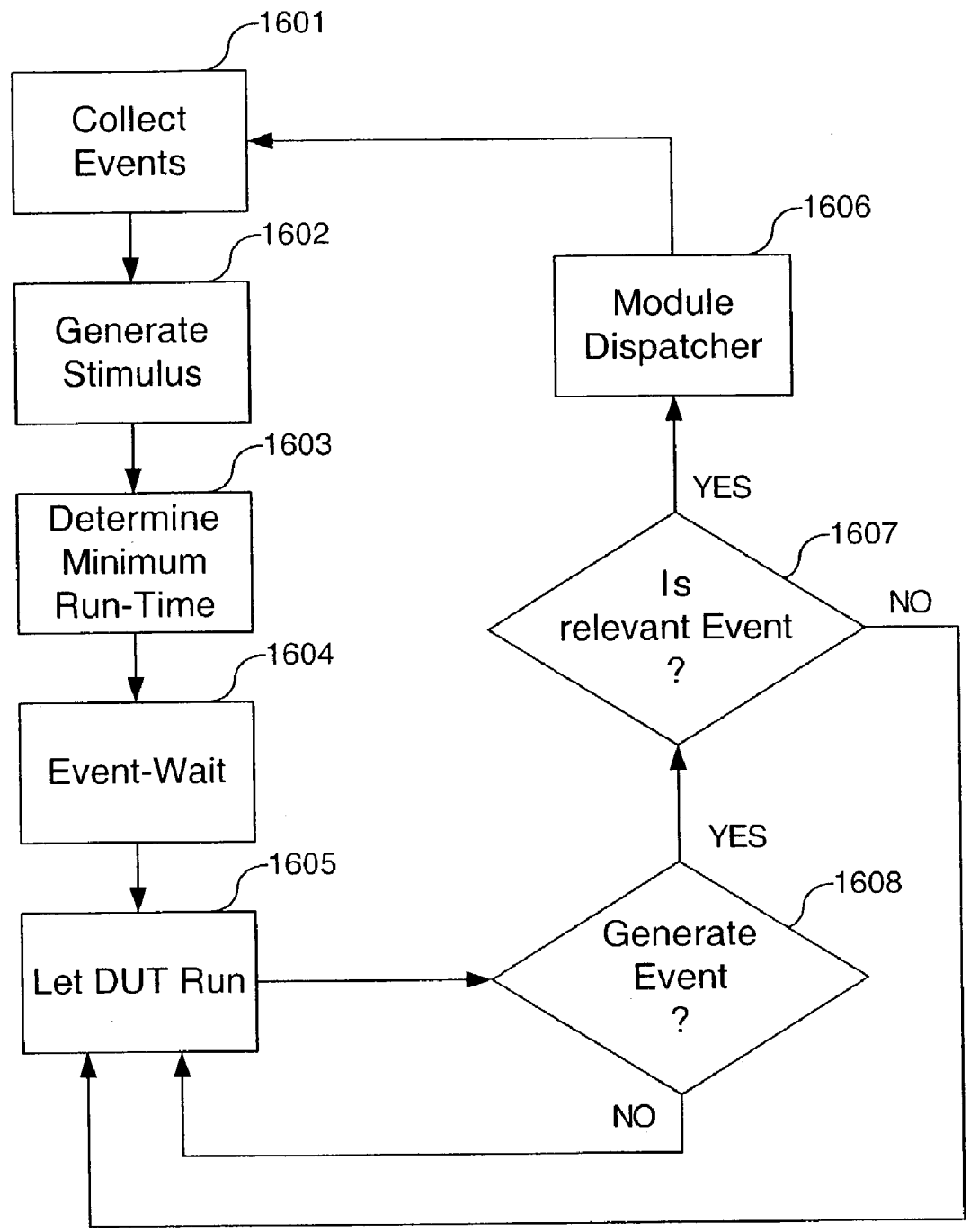
FIG. 1H is a flowchart illustrating the operation of an event-wait algorithm in accordance with an embodiment of the present invention.

FIG. 1H is a flowchart illustrating the operation of the event-wait algorithm. In step 1601, events are collected. In step 1602, stimulus for the DUT 128 is generated. In step 1603, minimum run time in terms of CCLK clock cycles is determined. In step 1604, event-wait state is entered by the application module 104. In step 1605, the DUT is allowed to run. If an event is generated, the system goes to step 1607, to determine if the event is relevant. At step 1608, if no event is generated, the DUT continues to run (Step 1605). If the event is not relevant (step 1607), the DUT goes back step 1605 (continue running). If the event is relevant, control goes to an event dispatcher (step 1606) that identifies the nature of the events. The system then goes back to step 1601.

Example Implementation Embodiment

Figure 12:
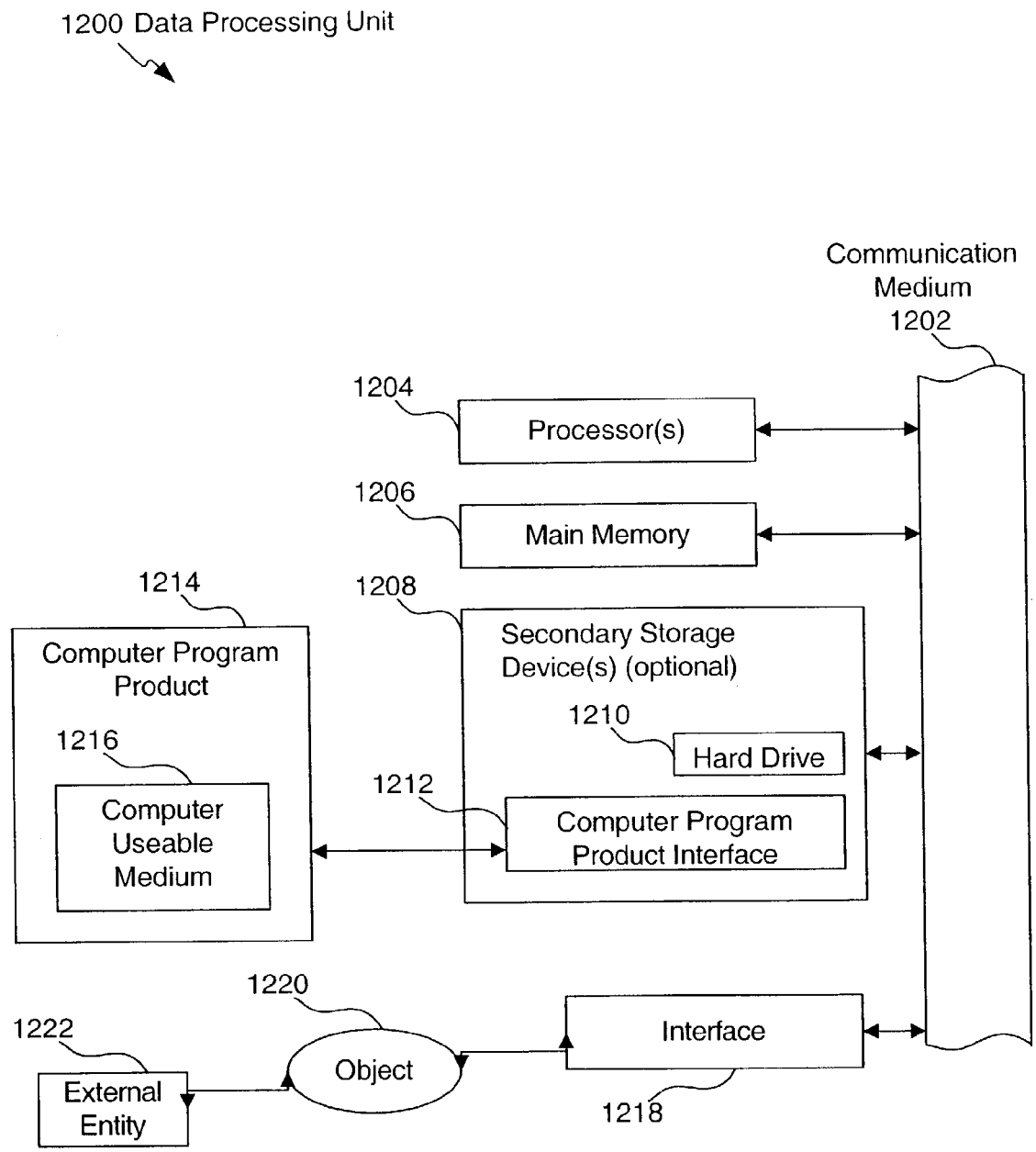
FIG. 12 is a block diagram of an example data processing unit useful for implementing the present invention.

FIG. 12 is a block diagram of an example data processing unit 1200 useful for implementing items of the present invention. It is noted that the entities shown in FIGS. 1A-8B may be implemented using any number of data processing units 1200, and the configuration actually used is implementation specific.

Data processing unit 1200 may represent personal computer(s), hand held computers, workstation(s), and/or any other type of data processing devices. Which type of data processing device used to implement entities shown in FIGS. 1A-8B is implementation specific.

Data processing unit 1200 includes a communication medium 1202 (such as a bus, for example) to which other modules are attached.

Data processing unit 1200 includes one or more processor(s) 1204, and a main memory 1206. Main memory 1206 may be RAM, ROM, or any other memory type, or combinations thereof.

Data processing unit 1200 may include secondary storage devices 1208, such as but not limited to hard drives 1210 or computer program product interfaces 1212. Computer program product interfaces 1212 are devices that access objects (such as information and/or software) stored in computer program products 1214. Examples of computer program product interfaces 1212 include, but are not limited to, floppy drives, ZIP™ drives, JAZ™ drives, optical storage devices, etc. Examples of computer program products 1214 include, but are not limited to, floppy disks, ZIP™ and JAZ™ disks, memory sticks, memory cards, or any other medium on which objects may be stored.

The computer program products 1214 include computer useable mediums in which objects may be stored, such as but not limited to optical mediums, magnetic mediums, etc.

Control logic or software may be stored in main memory 1206, secondary storage device(s) 1208, and/or computer program products 1214.

More generally, the term "computer program product" refers to any device in which control logic (software) is stored, so in this context a computer program product could be any memory device having control logic stored therein. The invention is directed to computer program products having stored therein software that enables a computer/processor to perform functions of the invention as described herein.

The data processing unit 1200 may also include an interface 1218, which may receive objects (such as data, applications, software, images, etc.) from external entities 1222 via any communication mediums including wired and wireless communication mediums. In such cases, the objects 1220 are transported between external entities 1222 and interface 1218 via signals. In other words, such signals include or represent control logic for enabling a processor or computer to perform functions of the invention. According to embodiments of the invention, such signals are also considered to be computer program products, and the invention is directed to such computer program products.

While specific embodiments of the present invention have been described above, it should be understood that they have been presented by way of example only, and not limitation. It will be understood by those skilled in the art that various changes in form and details may be made therein without departing from the spirit and scope of the invention as defined in the appended claims. Thus, the breadth and scope of the present invention should not be limited by any of the above-described exemplary embodiments, but should be defined only in accordance with the following claims and their equivalents.

What is claimed is:

1. A deterministically operated emulation system for verifying performance of a device under test (DUT) comprising:
   an application module that generates transactions to evaluate the DUT;
   a hardware transactor coupled to the application module, the transactor converting the transactions to commands designated for the DUT;
   an emulator coupled to the transactor, the emulator having a hardware channel controller that forwards the commands to the DUT, which produces a set of events in response to the commands;
   an emulation clock that can be started by the application module and that can be stopped by the transactor, wherein the starting and stopping of the clock is accurate to within one clock cycle,
   wherein the hardware transactor gathers the data while the clock is stopped and forwards the data to multiple output channels simultaneously when the clock is restarted,
   wherein multiple, independent parallel transactions are executed, and;
   wherein the set of events can be viewed in real-time or recorded for later review and can be compared with a set of expected or predicted events to evaluate performance of the DUT.

2. The system of claim 1, wherein the implementing logic on the channel controller controls the emulation clock so as to prevent simultaneous operation of the application module and the emulator.

3. A method for deterministically verifying the performance of a device under test (DUT) comprising:
   generating transactions to evaluate the DUT;
   converting the transactions to commands designated for the DUT;
   forwarding the commands to the DUT, which produces a set of events in response to the commands, wherein the commands are forwarded in a manner responsive to an emulation clock that may be started and stopped by a channel controller so as to verify operation of the DUT;
   wherein the emulation clock can be started by an application module and can be stopped by a hardware transactor, wherein the starting and stopping of the clock is accurate to within one clock cycle, and
   wherein the hardware transactor, gathers the data while the clock is stopped, and forwards the data to multiple output channels simultaneously when the clock is restarted, wherein multiple, independent parallel transactions are executed; and
   wherein the set of events can be viewed in real-time or recorded for later review and can be compared with a set of expected or predicted events to evaluate performance of the DUT.

4. The method of claim 3 further comprising stopping the emulation clock during the generating step and starting the emulation clock during the evaluating step.

* * * * *